US011522497B2

(12) United States Patent
Srinidhi Embar et al.

(10) Patent No.: US 11,522,497 B2
(45) Date of Patent: Dec. 6, 2022

(54) DOHERTY AMPLIFIER INCORPORATING OUTPUT MATCHING NETWORK WITH INTEGRATED PASSIVE DEVICES

(71) Applicant: NXP USA, Inc., Austin, TX (US)

(72) Inventors: Ramanujam Srinidhi Embar, Gilbert, AZ (US); Jeffrey Spencer Roberts, Tempe, AZ (US)

(73) Assignee: NXP USA, Inc., Austin, TX (US)

( * ) Notice: Subject to any disclaimer, the term of this patent is extended or adjusted under 35 U.S.C. 154(b) by 178 days.

(21) Appl. No.: 16/883,820

(22) Filed: May 26, 2020

(65) Prior Publication Data
US 2021/0376798 A1 Dec. 2, 2021

(51) Int. Cl.
*H03F 1/02* (2006.01)
*H03F 3/21* (2006.01)
*H01L 23/66* (2006.01)
*H03F 1/56* (2006.01)

(52) U.S. Cl.
CPC ........... *H03F 1/0288* (2013.01); *H01L 23/66* (2013.01); *H03F 1/56* (2013.01); *H03F 3/211* (2013.01); *H01L 2223/6611* (2013.01); *H01L 2223/6627* (2013.01); *H01L 2223/6655* (2013.01); *H03F 2200/222* (2013.01); *H03F 2200/387* (2013.01); *H03F 2200/451* (2013.01)

(58) Field of Classification Search
CPC .................................................. H03F 1/0288
See application file for complete search history.

(56) References Cited

U.S. PATENT DOCUMENTS

| 9,614,479 | B2 | 4/2017 | Hallberg et al. | |
| 9,966,903 | B1* | 5/2018 | McLaren | H03F 3/211 |
| 10,333,335 | B2 | 6/2019 | Cong et al. | |
| 10,498,292 | B1* | 12/2019 | Krvavac | H03F 1/565 |
| 11,121,072 | B1* | 9/2021 | Zhu | H01L 24/49 |
| 2009/0167438 | A1 | 7/2009 | Yang et al. | |
| 2010/0033243 | A1* | 2/2010 | Okazaki | H03F 1/0288 330/124 R |
| 2011/0140783 | A1* | 6/2011 | Blednov | H03F 1/0288 330/277 |
| 2012/0126891 | A1 | 5/2012 | Kim et al. | |

(Continued)

OTHER PUBLICATIONS

Notice of Allowance; U.S. Appl. No. 16/667,151; 8 pages (dated Oct. 29, 2020).

(Continued)

*Primary Examiner* — Patricia T Nguyen

(57) ABSTRACT

An amplifier includes a package that includes a carrier amplifier having a carrier amplifier input and output, a peaking amplifier having a peaking amplifier input and output, and corresponding input and output leads. The package includes a first integrated passive device including a first capacitor structure. The first integrated passive device includes a first contact pad coupled to the peaking amplifier output and a second contact pad coupled to the peaking output lead. The package includes a second integrated passive device including a second capacitor structure. The second integrated passive device includes a third contact pad coupled to the carrier amplifier output and a fourth contact pad coupled to the carrier output lead. The amplifier includes input circuitry a combining node configured to combine a carrier output signal and a peaking output signal.

18 Claims, 7 Drawing Sheets

(56) References Cited

U.S. PATENT DOCUMENTS

| | | | |
|---|---|---|---|
| 2014/0320214 A1 | 10/2014 | Liu | |
| 2015/0145601 A1* | 5/2015 | Moronval | H03F 1/07 330/295 |
| 2015/0188504 A1* | 7/2015 | Kesson | H04B 1/3833 330/286 |
| 2016/0043039 A1* | 2/2016 | Lakshminarayan | H03F 1/0288 257/659 |
| 2016/0268976 A1 | 9/2016 | Negra et al. | |
| 2016/0336903 A1* | 11/2016 | Ahmed | H03F 3/19 |
| 2017/0085228 A1* | 3/2017 | Abdo | H01L 23/66 |
| 2018/0331172 A1 | 11/2018 | Schultz et al. | |
| 2019/0074799 A1 | 3/2019 | Al et al. | |
| 2019/0115875 A1* | 4/2019 | Nikolayenkov | H03F 3/602 |
| 2019/0312552 A1 | 10/2019 | Chan et al. | |
| 2020/0186107 A1* | 6/2020 | Fu | H03F 1/565 |

OTHER PUBLICATIONS

Notice of Allowance; U.S. Appl. No. 16/667,113; 8 pages (dated Oct. 7, 2020).

U.S. Appl. No. 16/557,151; not yet published; 48 pages (filed Oct. 29, 2019).

U.S. Appl. No. 16/667,113; not yet published; 39 pages (filed Oct. 29, 2019).

Fang, Xiaohu et al; "Broadband, Wide Efficiency Range, Doherty Amplifier Design Using Frequency-varying Complex Combining Load"; IEEE MMT-S International Microwave Symposium; 4 pages (2015).

Fang, Xiao-Hu et al; "Two-Way Doherty Power Amplifier Efficiency Enhancement by Incorporating Transistors' Nonlinear Phase Distortion"; IEEE Microwave and Wireless Components Letters, vol. 28, No. 2; 3 pages (Feb. 2018).

Ozen, Mustafa et al; "Symmetrical Doherty Amplifier with High Efficiency over Large Output Power Dynamic Range"; IEEE MTT-S International Microwave Symposium; IEEE Explore; 4 pages (Jul. 10, 2014).

Ozen, Mustafa et al; "Symmetrical Doherty Power Amplifier With Extended Efficiency Range"; IEEE Transactions on Microwave Theory and Techniques, vol. 64, No. 4; 12 pages (Apr. 2016).

Peng, Yatao et al., "Modified output impedance matching solution for load modulation power amplifier performance enhancing", IET Microwaves, Antennas & Propagation, Oct. 22, 2015, pp. 1376-1385, vol. 9, Iss. 13, The Institute of Engineering and Technology, UK.

Xia Jing et al.: "A Broadband High-Efficiency Doherty Power Amplifier With Integrated Compensating Reactance", IEEE Transactions On Microwave Theory and Techniques, IEEE, USA, vol. 64, No. 7, Jul. 1, 2016 (Jul. 1, 2016), pp. 2014-2024.

* cited by examiner

DOHERTY AMPLIFIER INCORPORATING OUTPUT MATCHING NETWORK WITH INTEGRATED PASSIVE DEVICES

TECHNICAL FIELD

Embodiments of the subject matter described herein relate generally to Doherty power amplifiers.

BACKGROUND

For many years, the Doherty power amplifier has been one of the most popular amplifiers for cellular infrastructure applications. A two-way Doherty amplifier includes a carrier amplifier and a peaking amplifier, which are connected in parallel between an amplifier input and an amplifier output. During operation, an input radio frequency (RF) signal is divided into carrier and peaking signals, and a phase difference of 90 degrees is applied between the carrier and peaking signals prior to amplification by the carrier and peaking amplifiers. On the output side, the amplified carrier and peaking signals are then phase-aligned before the amplified signals are combined together by a signal combiner.

A Doherty amplifier may have a symmetric or an asymmetric configuration, where each configuration type has its advantages and disadvantages. In a symmetric Doherty amplifier, the carrier and peaking amplifiers have substantially the same current-carrying capability, which may be achieved by utilizing carrier and peaking power amplifiers of the same transistor size (or periphery). Conversely, in an asymmetric Doherty amplifier, the peaking amplifier typically has a significantly greater current-carrying capacity than the carrier amplifier. This may be achieved by utilizing a significantly larger sized peaking power amplifier than the carrier power amplifier.

In comparison with asymmetric Doherty amplifiers, conventional symmetric Doherty amplifiers tend to have better gain, RF bandwidth, and linearity (i.e., the AM-AM/AM-PM behavior is favorable for linearization). However, the load modulation for a symmetric Doherty amplifier is limited only to 2 (i.e., the variable standing wave ratio (VSWR) is about 2:1). Accordingly, the efficiency boost obtained for a modulated load in the back-off Doherty condition tends to be better for a conventional symmetric Doherty amplifier than it is for a class-AB power amplifier. However, the efficiency boost for a conventional symmetric Doherty amplifier is significantly poorer than for a conventional asymmetric Doherty amplifier. In contrast, because an asymmetric Doherty amplifier has a load modulation greater than 2 (i.e., VSWR>2:1), asymmetric Doherty amplifiers tend to have better back-off efficiency than both class-AB and conventional symmetric Doherty amplifiers. However, due to their nonlinear AM-AM/AM-PM behavior and the need for an uneven input RF signal split ratio, asymmetric Doherty amplifiers also are characterized by relatively lower back-off gain and poorer linearity, when compared with conventional symmetric Doherty amplifiers.

Amplifier designers strive to develop Doherty amplifier designs that achieve the advantages of both symmetric and asymmetric configurations, while avoiding the various disadvantages of the two configuration types. What is desired is a relatively simple Doherty amplifier design with improved performance (e.g., relatively-high gain, and linearizable power added efficiency) implemented with relatively-simple impedance matching circuitry.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
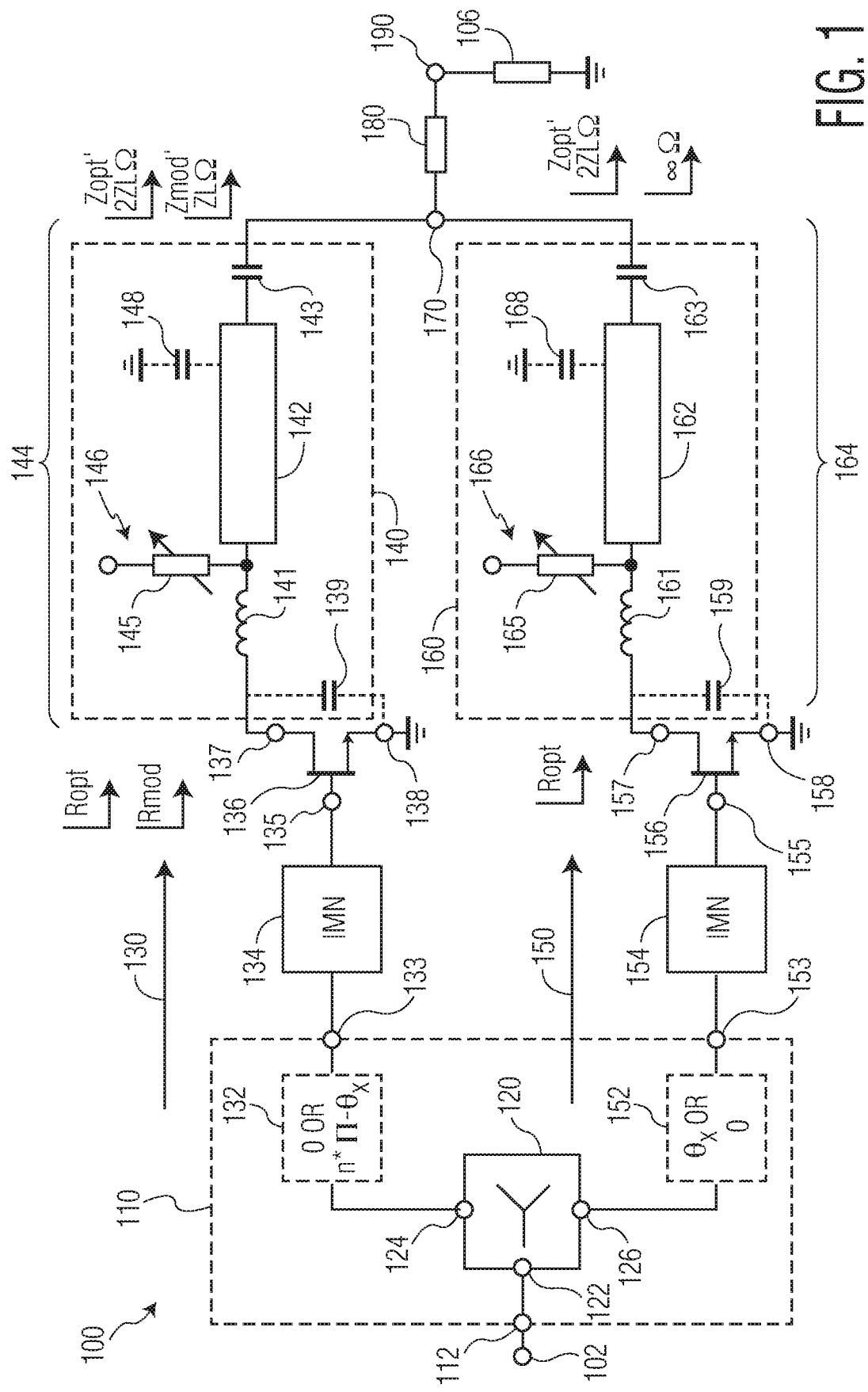
FIG. 1 is a schematic representation of a Doherty power amplifier, in accordance with an example embodiment.

Embodiments of the inventive subject matter include Doherty amplifier architectures that utilize symmetric or slightly asymmetric carrier and peaking power amplifier devices coupled to (or terminated with) a complex combining load matching circuit. In comparison with conventional, highly-asymmetric Doherty power amplifiers (e.g., asymmetric Doherty power amplifiers with a carrier to peaking ratio of 1:2 or greater), and in particular those terminated with a real load, the Doherty amplifier embodiments described herein may have the advantages of a more simplified power device design, since both the carrier and peaking power amplifier devices may be substantially identical. In addition, in a highly-asymmetric Doherty amplifier, the relatively-large peaking amplifier has a significantly larger source-drain capacitance than that of the carrier amplifier, and the asymmetrical parasitic effects increase the complexity of output matching circuits. Embodiments of the inventive subject matter exhibit reduced parasitic effects and ease of matching compared to conventional, highly-asymmetric Doherty amplifiers. Further, the various embodiments may be capable of achieving higher gain and more readily linearizable power added efficiency.

In embodiments of the present Doherty amplifier architecture, portions of a device's output matching circuitry may be implemented using integrated passive devices (IPDs). As described herein, by implementing aspects of the device's matching circuitry using IPDs aspects of the device performance may be improved. For example, such IPDs, incorporated into the output matching networks of the device's carrier and peaking power amplifier devices can enable the output matching networks to be positioned closer to the amplifier's power transistors. Such modification may enable the device to operate with improved radio frequency bandwidth, as compared to devices implementing conventional Doherty amplifier architectures using discrete components in the amplifier's output matching network. The present IPD-based amplifier configuration may be more compact that conventional amplifier layout, resulting in reduced overall package size and complexity. Additionally, because components of the amplifier are implemented within IPDs, as discussed below, component attributes (e.g., capacitance and inductance) may be established with higher accuracy and tolerances than conventional approaches using discrete components.

As used herein, the term "size", when referring to a physical characteristic of a power amplifier or power transistor, refers to the periphery or the current carrying capacity of the transistor(s) associated with that amplifier or transistor. The terms "symmetric" or "substantially symmetric", when referring to the relative sizes of carrier and peaking amplifiers, means that the size of the power transistor(s) forming the carrier amplifier is/are substantially identical to (i.e., within 5%) the size of the power transistor(s) forming the peaking amplifier. The term "slightly asymmetric", when referring to carrier and peaking amplifiers, means that the size of the power transistor(s) forming the carrier amplifier is/are about 5% to about 15% different from the size of the power transistor(s) forming the peaking amplifier. Conversely, the term "asymmetric," without any other qualifiers, means that the size of the power transistor(s) forming the carrier amplifier is/are more than 15% different from the size of the power transistor(s) forming the peaking amplifier. "Highly-asymmetric," as used herein, means that the size of the power transistor(s) forming the peaking amplifier is/are 100% or more than the size of the power transistor(s) forming the carrier amplifier. Accordingly, for example, when the ratio of carrier amplifier size to peaking amplifier size (or the "carrier-to-peaking ratio") is denoted as x:y (where x corresponds to relative carrier amplifier size and y corresponds to relative peaking amplifier size), a ratio of 1:1 would be symmetric, a ratio of 1:1.04 would be substantially symmetric, a ratio of 1:1.15 would be slightly asymmetric, and a ratio of 1:1.3 would be asymmetric, according to the above definitions. Further, as used herein, the term "shunt" means electrically coupled between a circuit node and a ground reference (or other DC voltage reference).

FIG. 1 illustrates a simplified schematic of a two-way Doherty power amplifier 100, according to an embodiment. Doherty amplifier 100 includes an RF input 102, an RF output 190, input circuitry 110, a carrier amplification path 130, a peaking amplification path 150, and a combining node 170. An antenna 106 (or another type of load) is coupled to the combining node 170 through a complex combining load matching circuit 180 and the RF output 190. In a conventional Doherty amplifier, a combining load is a real load (i.e., a load with a real impedance). According to an embodiment of the inventive subject matter, the complex combining load matching circuit 180 is an impedance transformer (or matching network), which transforms the impedance at node 190 to the impedance at combining node 170, as will be described in more detail later.

Doherty power amplifier 100 is considered to be a "two-way" Doherty power amplifier, which includes one carrier amplification path 130 and one peaking amplification path 150. Essentially, the carrier amplifier 136 provides RF signal amplification along the carrier amplification path 130, and the peaking amplifier 156 provides RF signal amplification along the peaking amplification path 150. The amplified carrier and peaking RF signals are then combined at combining node 170 before provision to the complex combining load matching circuit 180 and RF output 190.

The input circuitry 110 has an input 112 coupled to the RF input 102, and two outputs, where each output is coupled to one of a carrier or peaking path input 133, 153 to the carrier and peaking amplification paths 130, 150, respectively. The input circuitry 110 is configured to receive, at input 112, an input RF signal from RF input 102, and to divide the power of the input RF signal into a carrier input RF signal and a peaking RF input signal. The input circuitry 110 is further configured to provide, at carrier path input 133, the carrier input RF signal to the carrier amplification path 130, and to provide, at peaking path input 153, the peaking input RF signal to the peaking amplification path 150. According to an embodiment, the input circuitry 110 is configured to produce the carrier and peaking input RF signals with a desired phase difference (referred to as an "input phase offset") between the carrier and peaking input RF signals.

In some embodiments, the input circuitry 110 includes a digital signal processor configured to produce and provide the carrier and peaking input RF signals with the desired input phase offset. In other embodiments, and as illustrated in FIG. 1, the input circuitry 110 includes a power splitter 120 and one or more input phase shift elements 132, 152 (e.g., input offset lines) configured to produce and provide the carrier and peaking input RF signals with the desired input phase offset. The power splitter 120 has an input 122 coupled to the input circuitry input 112 and the RF input 102, and carrier and peaking outputs 124, 126 coupled to the carrier and peaking amplification paths 130, 150, respectively. Essentially, power splitter 120 is configured to divide the power of the input RF signal received at power splitter input 122 (through RF input 102 and input circuitry input 112) into carrier and peaking portions of the input signal (i.e., the carrier input RF signal and the peaking input RF signal). The carrier input RF signal is provided to the carrier amplification path 130 at power splitter output 124, and the peaking input RF signal is provided to the peaking amplification path 150 at power splitter output 126. As will be explained in more detail below, during operation in a relatively low-power mode, only the carrier amplifier 136 is supplying current to the complex combining load matching circuit 180 and antenna 106, and the power splitter 120 provides the input signal power only to the carrier amplification path 130. Conversely, during operation in a relatively high-power mode, both the carrier and peaking amplifiers 136, 156 supply current to the complex combining load matching circuit 180 and antenna 106, and the power splitter 120 divides the input signal power between the amplification paths 130, 150.

Power splitter 120 may have any of a variety of configurations, including Wilkinson-type splitters, hybrid quadrature splitters, and so on. Power splitter 120 divides the power of the input RF signal according to a carrier-to-peaking size ratio. For example, when Doherty amplifier 100 has a symmetric or substantially-symmetric Doherty amplifier configuration in which the carrier amplifier 136 and the peaking amplifier 156 are substantially equal in size (i.e., the Doherty amplifier 100 has a 1:1 to 1.05 carrier-to-peaking size ratio), the power splitter 120 may divide the power such that about half of the input signal power is provided to the carrier amplification path 130, and about half of the input signal power is provided to the peaking amplification path 150. Similarly, when Doherty amplifier 100 has a slightly asymmetric Doherty amplifier configuration (i.e., the Doherty amplifier 100 has a 1:1.05 to 1.15 carrier-to-peaking size ratio), the power splitter 120 may divide the power such that slightly less than half of the input signal power is provided to the carrier amplification path 130, and slightly more than half of the input signal power is provided to the peaking amplification path 150.

In Doherty amplifier 100, the input circuitry 110 is configured so that the input signal supplied to the peaking amplification path 150 is delayed by an input phase offset with respect to the input signal supplied to the carrier amplification path 130 at the center frequency of operation, f0, of the amplifier 100. When included, the carrier and/or peaking input phase shifters 132, 152 are configured to impart the desired input phase offset between the carrier and peaking input RF signals.

To ensure proper operation of the Doherty amplifier 100, and as will be described in detail below, the magnitude of the input phase offset is determined based on the electrical lengths 144, 164 of the carrier and peaking output circuits 140, 160. In other words, the values of the phase shifts imparted by phase shifters 132, 152 (which determine the input phase offset) depend on the electrical lengths 144, 164 of the carrier and peaking output circuits 140, 160, in an embodiment. The electrical length 144 of the carrier output circuit 140 is a non-zero value referred to herein as theta x ($\theta_x$). Essentially, the electrical length 144, $\theta_x$, corresponds to the phase shift imparted on the carrier output RF signal between the output 137 of the carrier amplifier 136 and the combining node 170 (i.e., the insertion phase length for the carrier amplifier output matching circuit). As will be explained in detail later, the electrical length 144, $\theta_x$, is a value that is mathematically derived from the complex load presented at combining node 170. In other words, the structure of the complex combining load matching circuit 180 determines the value of the electrical length 144. Conversely, the electrical length 164 of the peaking output circuit 160 may equal about 0 degrees or about n*π (i.e., n*180 degrees), where n=an integer value (e.g., 1, 2, 3, . . . ), in various embodiments, and "*" is a multiplication operation. As will be explained in more detail below, the phasing relationship of the carrier and peaking output circuits 140, 160 on the output-side of the amplifiers 136, 156 determines the phasing applied to the carrier and peaking input RF signals on the input-side of the amplifiers 136, 156.

As a governing rule, the electrical length of the carrier amplification path 130 (i.e., a sum of the phase shift applied by phase shifter 132, the insertion phase of IMN 134, the insertion phase of amplification device 136, and the electrical length 144 ($\theta_x$) of the carrier output circuit 140, including parasitic capacitance 139) should equal the electrical length of the peaking amplification path 150 (i.e., a sum of the phase shift applied by phase shifter 152, the insertion phase of IMN 154, the insertion phase of amplification device 156, and the electrical length 164 of the peaking output circuit 160, including parasitic capacitance 159 (0 or n*180 degrees)) to ensure that the signals amplified along the carrier and peaking amplification paths 130, 150 combine coherently (in phase) at combining node 170. This rule indicates that at least two combinations of different phase shifts may be implemented with phase shifters 132, 152, while still ensuring coherency of the amplified carrier and peaking RF signals at combining node 170:

1) PS 132 (phase shift imparted by phase shifter 132)=0;
   PS 152 (phase shift imparted by phase shifter 152)=$\theta_x$;
   EL 144 (electrical length 144 of carrier output circuit 140)=$\theta_x$; and
   EL 164 (electrical length 164 of peaking output circuit 160)=0 degrees.

When the electrical length 164 of the peaking output circuit 160 is about 0 degrees, phase shifter 132 may be excluded, as it otherwise would be configured to avoid imparting a phase shift on the carrier input RF signal (or to impart 0 degrees of phase shift), and phase shifter 152 is configured to impart a phase shift of $\theta_x$ on the peaking input RF signal. In this example embodiment, the sum of the phase shift applied by phase shifter 132 (0 degrees, in this example) plus the electrical length 144 ($\theta_x$) of the carrier output circuit 140 equals $\theta_x$ degrees, and the sum of the phase shift applied by phase shifter 152 ($\theta_x$, in this example) plus the electrical length 164 (0 degrees, in this example) are equal to each other. The input phase offset is $\theta_x$ degrees, and both sums are equal to $\theta_x$ degrees.

2) PS 132 (phase shift imparted by phase shifter 132)=n*180 degrees-$\theta_x$;
   PS 152 (phase shift imparted by phase shifter 152)=0;
   EL 144 (electrical length 144 of carrier output circuit 140)=$\theta_x$; and
   EL 164 (electrical length 164 of peaking output circuit 160)=n*180 degrees.

When the electrical length 164 of the peaking output circuit 160 is about n*180 degrees, phase shifter 152 may be excluded, as it otherwise would be configured to avoid imparting a phase shift on the peaking input RF signal (or to impart 0 degrees of phase shift), and phase shifter 132 is configured to impart a phase shift of n*180 degrees-$\theta_x$ on the carrier input RF signal. In this example embodiment, the sum of the phase shift applied by phase shifter 132 (n*180 degrees-$\theta_x$, in this example) plus the electrical length 144 ($\theta_x$) of the carrier output circuit 140 equals n*180 degrees, and the sum of the phase shift applied by phase shifter 152 (0, in this example) plus the electrical length 164 (n*180 degrees, in this example) are equal to each other. The input phase offset is n*180 degrees-$\theta_x$ degrees, and both sums are equal to n*180 degrees.

The above combinations assume that the IMNs 134, 154 each impart the same insertion phase, and that the amplification devices 136, 156 also each impart the same insertion phase. In practice, the IMNs 134, 154 may impart different insertion phases and/or the amplification devices 136, 156 may impart different insertion phases. In a practical design, and as would be understood by those of skill in the art based on the description herein, when either or both the IMNs 134, 154 and/or the amplification devices 136, 156 impart different insertion phases from each other, the input phase shifters 132, 152 may have different phase shifts than the "ideal" phase shifts depicted in FIG. 1.

According to an embodiment, the input phase offset at the carrier and peaking path inputs 133, 153 is in a range from about 20 degrees to about 160 degrees (i.e., the input phase offset corresponds to a phase difference of 20 degrees to 160 degrees between the carrier and peaking input RF signals at the carrier and peaking path inputs 133, 153). In an alternate embodiment, the electrical length 144 of the carrier output circuit 140 is smaller or larger than 90 degrees (e.g., the electrical length 144 is between 20 degrees and 86 degrees or between 94 degrees and 160 degrees), and the input phase offset at the carrier and peaking path inputs 133, 153 is in a first range from about 20 degrees to about 86 degrees or in a second range of about 94 degrees to about 160 degrees. Said another way, the electrical length 144 of the carrier output circuit 140 (or the input phase offset) is between 20 degrees and 160 degrees, excluding electrical lengths (or offsets) between 86 degrees and 94 degrees.

The carrier input phase shifter 132, when included, may comprise distinct circuitry that forms a portion of the input circuitry 110, in one embodiment. In another embodiment, the functionality of the carrier input phase shifter 132 (i.e., the application of a phase shift to the carrier input RF signal) may be included in the power splitter 120. Similarly, the peaking input phase shifter 152 may include distinct circuitry that forms a portion of the input circuitry 110, in one embodiment. In another embodiment, the functionality of the peaking input phase shifter 152 (i.e., the application of a phase shift to the peaking input RF signal) may be included in the power splitter 120. In other words, the power splitter 120 may be configured to produce carrier and peaking RF input signals that have the desired input phase offset, and distinct input phase shifter(s) (e.g., phase shifter(s) 132, 152) may be excluded.

The carrier amplification path 130 includes a carrier input matching network (IMN) 134, the carrier amplifier 136, and a carrier output circuit 140. According to some embodiments, the carrier amplification path 130 also includes the carrier input phase shifter 132. Similarly, the peaking amplification path 150 includes a peaking IMN 154, the peaking amplifier 156, and a peaking output circuit 160. According to some embodiments, the peaking amplification path 150 also includes the peaking input phase shifter 152.

The carrier and peaking IMNs 134, 154 are coupled between the carrier and peaking path inputs 133, 153 and the carrier and peaking amplifiers 136, 156, respectively. The carrier and peaking IMNs 134, 154 each may include, for example, lowpass or bandpass circuits configured as T or pi networks. For example, each of the carrier and peaking IMNs 134, 154 may include a T-network that includes two series-coupled inductors (e.g., bond wire arrays) with a shunt capacitor coupled to a node between the inductors. In the present disclosure, a bond wire array may include multiple bond wires coupled in parallel between contact pads to establish an electrical connection or, alternatively, a bond wire array may include only a single bond wire connected between such contact pads. However they are configured, the IMNs 134, 154 incrementally increase the circuit impedance toward the source impedance.

The carrier and peaking amplifiers 136, 156 each have a control input 135, 155 (e.g., a gate terminal) and two current-carrying terminals 137, 138, 157, 158 (e.g., drain and source terminals), where one of the current-carrying terminals 137, 157 (e.g., the drain terminal) of each amplifier 136, 156 functions as an output for an amplified RF signal produced by the amplifier 136, 156, and the other current-carrying terminal 138, 158 (e.g., the source terminal) of each amplifier 136, 156 may be coupled to a ground reference node. According to an embodiment, current-carrying terminals 137, 157 (e.g., drain terminals) correspond to an intrinsic current generator (e.g., an intrinsic drain) of the amplifier 136, 156. Capacitances 139, 159 represent parasitic capacitances (e.g., drain-source capacitances) present at the outputs 137, 157 of the carrier and peaking amplifiers 136, 156 (e.g., at the drain terminals of the final-stage power transistors). Although capacitances 139, 159 are not discrete physical components (e.g., discrete capacitors), capacitances 139, 159 are shown to be included within the carrier and peaking output circuits 140, 160, as their capacitance values are substantial enough to affect the electrical lengths 144, 164 of the carrier and peaking output circuits 140, 160. According to an embodiment, capacitances 139, 159 each have capacitance values in a range of about 0.25 picofarads (pF) to about 20 pF, although the capacitance values may be lower or higher, as well.

Each of the carrier and peaking amplifier 136, 156 includes one or more power transistors (e.g., field effect transistors) embodied in a semiconductor die (e.g., a single semiconductor die that includes both the carrier and peaking amplifier power transistors, or a separate die for each of the carrier and peaking amplifier transistors). In some embodiments, the semiconductor die(s) that include the carrier and peaking amplifiers 136, 156 may be packaged in a power amplifier package 120 (e.g., power amplifier package 630, FIG. 6), along with all or portions of the carrier and peaking IMNs 134, 154.

According to an embodiment, the carrier amplifier 136 and the peaking amplifier 156 each include a single-stage amplifier (i.e., an amplifier with a single amplification stage or power transistor). In other embodiments, the carrier amplifier 136 is a two-stage amplifier, which includes a relatively low-power driver amplifier (not shown) and a relatively high-power final-stage amplifier (not shown) connected in a cascade (or series) arrangement between the carrier amplifier input 135 and the carrier amplifier output 137. In the carrier amplifier cascade arrangement, an output (e.g., drain terminal) of the driver amplifier is electrically coupled to an input (e.g., gate terminal) of the final-stage amplifier. Similarly, the peaking amplifier 156 may include a two-stage amplifier, which includes a relatively low-power driver amplifier (not shown) and a relatively high-power final-stage amplifier (not shown) connected in a cascade arrangement between the peaking amplifier input 155 and the peaking amplifier output 157. In the peaking amplifier cascade arrangement, an output (e.g., drain terminal) of the driver amplifier is electrically coupled to an input (e.g., gate terminal) of the final-stage amplifier. In other embodiments, each of the carrier amplifier 136 and the peaking amplifier 156 may include more than two, cascade-coupled amplification stages.

Amplifiers 136 and 156 may be fabricated using any suitable semiconductor technology and may include gallium nitride (GaN) or laterally-diffused metal-oxide semiconductor (LD-MOS) devices.

As used herein, the "size" of an amplifier refers to the size of the output-stage transistor (i.e., the size of the single transistor in a single-stage amplifier, or the size of the final-stage transistor in a multi-stage amplifier). According to an embodiment, Doherty power amplifier 100 is symmetric or substantially symmetric, in that the carrier and peaking amplifiers 136, 156 are of substantially equal size (i.e., the peripheries/current carrying capacities of the carrier and peaking power transistors are substantially equal). In such embodiments, the carrier-to-peaking ratio may be in a range of about 1:1 to about 1:1.05, for example. In other embodiments, Doherty power amplifier 100 is slightly asymmetric, in that the carrier and peaking amplifiers 136, 156 are of modestly different size. In such embodiments, the carrier-to-peaking ratio may be in a range of about 1:05 to about 1:1.15, for example.

One or more bias circuits (e.g., bias circuits 146, 166) may provide DC bias voltages to the carrier and peaking amplifiers 136, 156 to ensure proper operation of the Doherty amplifier 100. Although FIG. 1 only illustrates output-side bias circuits 146, 166 (e.g., drain bias circuits), additional bias circuits (not shown) also may be implemented at the inputs (e.g., gate bias circuits) to the amplifiers 136, 156. During operation of Doherty amplifier 100, the carrier amplifier 136 is biased to operate in class AB mode or deep class AB mode, and the peaking amplifier 156 is biased to operate in class C mode or deep class C mode. In some configurations, the peaking amplifier 156 may be biased to operate in class B mode.

The carrier and peaking amplifiers 136, 156 are coupled to the combining node 170 through carrier and peaking output circuits 140, 160, respectively. At low to moderate input signal power levels (i.e., where the power of the input signal at RF input 102 is lower than the turn-on threshold level of peaking amplifier 156), the Doherty amplifier 100 operates in a low-power mode in which the carrier amplifier 136 operates to amplify the input signal, and the peaking amplifier 156 is minimally conducting (e.g., the peaking amplifier 156 essentially is in an off state). During this phase of operation, the carrier output circuit 140 determines the maximum VSWR (voltage standing wave ratio) to which the carrier amplifier 136 will be exposed. Conversely, as the input signal power increases to a level at which the carrier amplifier 136 reaches voltage saturation, the power splitter 120 divides the energy of the input signal between the carrier and peaking amplifier paths 130, 150, and both amplifiers 136, 156 operate to amplify their respective portion of the input signal.

As the input signal level increases beyond the point at which the carrier amplifier 136 is operating in compression, the peaking amplifier 156 conduction also increases, thus supplying more current to the complex combining load matching circuit 180 and antenna 106. In response, the load line impedance of the carrier amplifier output decreases. In fact, an impedance modulation effect occurs in which the load line of the carrier amplifier 136 changes dynamically in response to the input signal power (i.e., the peaking amplifier 156 provides active load pulling to the carrier amplifier 136). The carrier output circuit 140, which is coupled between the output 137 of the carrier amplifier 136 and the combining node 170, transforms the carrier amplifier load line impedance to a high value at backoff, allowing the carrier amplifier 136 to efficiently supply power to the complex combining load matching circuit 180 and antenna 106 over an extended output power range.

The electrical length 144 of the carrier output circuit 140, including the adjustment imparted by the parasitic output capacitance 139, corresponds to the phase shift applied by the carrier output circuit 140 to the carrier RF output signal between the carrier amplifier output 137 and the combining node 170. Similarly, the electrical length 164 of the peaking output circuit 160, including the adjustment imparted by the parasitic output capacitance 159, corresponds to the phase shift applied by the peaking output circuit 160 to the peaking RF output signal between the peaking amplifier output 157 and the combining node 170. According to one embodiment, and as mentioned above, the peaking output circuit 160, which is connected between the peaking amplifier output 157 and the combining node 170, may have an electrical length 164 equal to about 0 degrees. In another embodiment, the peaking output circuit 160 may have an electrical length 164 equal to about n*180 degrees (n=an integer value, such as 1, 2, 3, . . . ).

According to further embodiments, and as also mentioned above, the carrier output circuit 140, which is connected between the carrier amplifier output 137 and the combining node 170, has an electrical length 144, θx. The input phase offset applied by the input circuitry 110 (e.g., the input phase offset established by phase shifter(s) 132, 152) is related to the electrical length 144 and the electrical length 164 of the peaking output circuit 160. More specifically, as described previously, the input phase offset is about equal to the electrical length 144, θx, of the carrier output circuit 140 when the electrical length 164 of the peaking output circuit 160 is about 0 degrees. Conversely, the input phase offset is about equal to n*180 degrees minus θx when the electrical length 164 of the peaking output circuit 160 is about n*180 degrees.

The carrier and peaking output circuits 140, 160 are configured to establish the desired electrical lengths 144, 164 discussed above. According to an embodiment, carrier output circuit 140 comprises a series inductance 141, an impedance transformation element 142, and a capacitor 143, electrically coupled in series between the carrier amplifier output 137 and the combining node 170. For example, the series inductance 141 may represent the inductance of various conductive structures (e.g., bond wire arrays and an output lead) between the carrier amplifier output 137 and the impedance transformation element 142. As described later in conjunction with FIG. 6, the impedance transformation element 142 may include, for example, a transmission line coupled between inductance 141 and capacitor 143. Capacitor 143 is electrically coupled between impedance transformation element 142 and the combining node 170.

As will be described in more detail in conjunction with FIG. 2, inductance 141, impedance transformation element 142, and capacitor 143 form portions of a carrier output matching network (OMN), which is configured to further increase the circuit impedance toward the load impedance. According to an embodiment, the carrier OMN may further include one or more shunt passive elements that configure the OMN as a T or pi output matching network. For example, as will be described in conjunction with FIG. 2, below, a T-network may be established by including a first shunt passive element 145 between the carrier amplifier output 137 and impedance transformation element 142. For example, the first shunt passive element 145 may be a shunt inductance or capacitance provided by a portion of bias circuit 146 (e.g., a drain feed line of the bias circuit 146). According to an embodiment, the first shunt passive element 145 may be considered to be variable, in that the length of the drain feed line may be readily modified during design of amplifier 100, and thus the value of the shunt inductance or capacitance may be readily selected during design. A pi-network may be established by including an additional shunt passive component (e.g., capacitor 148) along the impedance transformation element 142 (or between the impedance transformation element 142 and capacitor 143).

Similarly, and according to a further embodiment, peaking output circuit 160 comprises a series inductance 161, an impedance transformation element 162, and a capacitor 163, electrically coupled in series between the peaking amplifier output 157 and the combining node 170. For example, the series inductance 161 may represent the inductance of various conductive structures (e.g., bond wire arrays and an output lead) between the peaking amplifier output 157 and the impedance transformation element 162. The impedance transformation element 162 may include, for example, a transmission line segment coupled between inductance 161 and capacitor 163. Capacitor 163 is electrically coupled between impedance transformation element 162 and the combining node 170.

As will be described in more detail in conjunction with FIG. 2, inductance 161, impedance transformation element 162, and capacitor 163 form portions of a peaking OMN, which is configured to further increase the circuit impedance toward the load impedance. According to an embodiment, the peaking OMN may further include one or more shunt passive elements that configure the OMN as a T or pi output matching network. Again, as will be described in conjunction with FIG. 2, below, a T-network may be established by including a first shunt passive element 165 between the peaking amplifier output 157 and impedance transformation element 162. For example, the first shunt passive element 165 may be a shunt inductance or capacitance provided by a portion of bias circuit 166 (e.g., a drain feed line of the bias circuit 146). According to an embodiment, the first shunt passive element 165 may be considered to be variable, in that the length of the drain feed line may be readily modified during design of amplifier 100, and thus the value of the shunt inductance or capacitance may be readily selected during design. A pi-network may be established by including an additional shunt passive component (e.g., capacitor 168) along the impedance transformation element 162 (or between the impedance transformation element 162 and capacitor 163).

As discussed above, the carrier and peaking output circuits 140, 160 inherently include output matching networks (OMNs) comprised of an assembly of output circuit components. The carrier and peaking OMNs can have a number of different configurations, while still achieving substantially the same performance and benefits of the embodiment of FIG. 1. To further illustrate, FIG. 2 is a schematic representation of a portion of a Doherty amplifier 200, which illustrates the output network and, specifically, the carrier and peaking OMNs and the complex combining node of an amplifier device, in accordance with another example embodiment. More specifically, FIG. 2 is intended to convey a configuration of the carrier and peaking output matching networks in which various components of the same are implemented within and provided by an IPD. IPDs are integrated electronic components that include a semiconductor substrate formed from any of a variety of semiconductor materials, including but not limited to silicon (including silicon-on-insulator, silicon-on-sapphire, and other silicon-based composite substrates), gallium arsenide (GaAs), GaN, including GaN-on-silicon, and other GaN-based composite substrates, and so on. IPDs include a plurality of conductive layers and insulating layers formed over the substrate. The various insulating and conductive layers are patterned and, in combination with the substrate, can form a number of electronic components, such as capacitors and inductors, within the IPD. A typical IPD may include a number of capacitor and inductor structures, each connected to contact pads on surfaces of the IPD enabling external circuits to be electrically connected to those capacitor and inductor structures formed within the IPD.

As with the Doherty amplifier of FIG. 1, Doherty amplifier 200 includes a carrier amplifier 136 and a peaking amplifier 156. Although not shown in FIG. 2, inputs 135, 155 of the carrier and peaking amplifiers 136, 156 could be coupled through input matching networks (e.g., IMNs 134, 154, FIG. 1) and phase shift elements (e.g., phase shift elements 132, 152, FIG. 1) to a power splitter (e.g., power splitter 120, FIG. 1). Further, one current-carrying terminal 138, 158 (e.g., a source terminal) of each amplifier 136, 156 may be coupled to a ground reference, and a parasitic capacitance 139, 159 (e.g., drain-source capacitance) may be present between the current-carrying terminals 137, 138, 157, 158 of each amplifier 136, 156. In the embodiment of FIG. 2, an OMN 240, 260 is coupled between an output terminal 137, 157 (e.g., a drain terminal) of each amplifier 136, 156 and a combining node 170. Further, a complex combining load matching circuit 180 is coupled between the combining node 170 and an RF output (not shown), which in turn may be coupled to an antenna or another load.

According to an embodiment, Doherty power amplifier 200 is symmetric or substantially symmetric, in that the carrier and peaking amplifiers 136, 156 are of substantially equal size (i.e., the peripheries/current carrying capacities of the carrier and peaking power transistors are substantially equal). In such embodiments, the carrier-to-peaking ratio may be in a range of about 1:1 to about 1:1.05, for example. In other embodiments, Doherty power amplifier 200 is slightly asymmetric, in that the carrier and peaking amplifiers 136, 156 are of modestly different size. In such embodiments, the carrier-to-peaking ratio may be in a range of about 1:05 to about 1:1.15, for example.

One or more bias circuits (e.g., bias circuits 146, 166) may provide DC bias voltages to the carrier and peaking amplifiers 136, 156 to ensure proper operation of the Doherty amplifier 200. Although FIG. 2 only illustrates output-side bias circuits 146, 166 (e.g., drain bias circuits), additional bias circuits (not shown) also may be implemented at the inputs (e.g., gate bias circuits) to the amplifiers 136, 156.

The DC voltage applied to carrier amplifier 136 by bias circuit 146 is established by the drain voltage supply 201. Drain voltage supply 201 is connected to a package lead (represented by dashed box 202) that operates as a bias feed line and may be formed over a substrate of amplifier device 200. Within the package lead designated by dashed box 202, inductor 203a and capacitor 203b are virtual components and represent, respectively, the inductance and the capacitance of the package lead 202.

Package lead 202 is connected to terminal 206 of IPD 204 through inductor 205 (e.g., a bond wire array). Inductor 205 represents the inductance of the electrical connection (e.g., a bond wire array or package lead) that couples package lead 202 to terminal 206 of IPD 204. A number of electrical components are formed within IPD 204. Terminal 206 of IPD 204 is connected to a resonator 207 formed by structures within IPD 204. Specifically, resonator 207 includes a capacitor 208 and inductor 209 connected in parallel. In an embodiment, capacitor 208 may have a capacitance ranging from 1 pF to 100 pF and inductor 209 may have an inductance ranging from 20 pico Henrys (pH) to 1 nano Henry (nH), though in various embodiments other capacitance and inductance values may be used. During operation of amplifier 200, capacitor 208 and inductor 209 resonate at the center frequency of operation, f0, of device 200, causing resonator 207 to operate as a relatively high impedance or open circuit for signals having a frequency of or around f0. As such, resonator 207 operates to isolate the bias feeding network including drain voltage supply 201 and package lead 202 from the carrier amplification path connected to the output 137 of amplifier 136 so that the bias feed network does not interfere with the operation of the carrier amplifier path at frequencies of or around f0. Resonator 207 does not affect DC signals and, as such, the DC signals generated by drain voltage supply 201 can pass through resonator 207 enabling DC voltage biasing of the output 137 of amplifier 136.

Resonator 207 is, in turn, connected to terminal 210 of IPD 204. Terminal 210 of IPD 204 is electrically connected to output terminal 137 of amplifier 136 through inductor 211. Inductor 211 represents the inductance of the electrical connection (e.g., a bond wire array) that couples terminal 210 of IPD 204 to output terminal 137.

IPD 204 further includes capacitors 212 and 213 formed within IPD 204. Capacitor 212 is connected between terminal 210 and a ground reference node in a shunt arrangement, while capacitor 213 is connected between terminal 210 of IPD 204 and combining node 170 through terminal 214 of IPD 204 and inductor 215. Capacitor 212 may have a value in a range between about 1 pF to 100 pF, and capacitor 213 may have a value in a range between about 1 pF to 100 pF, although the capacitance values may be lower or higher, in other embodiments. Inductor 215 represents the inductance of the electrical connection (e.g., a bond wire array) that couples terminal 214 to combining node 170.

By incorporating series capacitor 213 into IPD 204, tolerances in the capacitance value of capacitor 213 can be improved as compared to implementations in which capacitor 213 is provided by a discrete capacitor component incorporated into the amplifier. Additionally, by incorporating capacitor 213 into IPD 204, capacitor 213 can be brought into closer proximity to the output of amplifier 136 enabling capacitor 213 to have a higher capacitance value while still providing adequate and appropriate output matching. Because capacitor 213 in this implementation may have a higher capacitance value than in conventional configurations, capacitor 213 may be easier to fabricate than discrete capacitors implementation, in which the discrete components may require a capacitance around 10 times less that the present IPD-based implementation. Such discrete components having relatively low capacitance are generally difficult to manufacture accurately and consistently. Accordingly, by enabling a higher capacitance value of capacitor 213 integrated into IPD 204 as compared to conventional solutions, more accurate output matching (across the entire targeted band of operation of device 200) may be achieved in the present amplifier 200.

In some embodiments, amplifier 200 may further include an optional second harmonic frequency resonator 216 (or "2*f0 resonator") connected to output 137 of amplifier 139. Resonator 216 includes an inductor 217 (e.g., a bond wire array) and a capacitor 218 connected in series between output 137 and a ground reference node. In some embodiments, capacitor 218 may be provided as a discrete capacitor component, or could be implemented as a capacitive structure within IPD 204. Capacitor 218, in some applications, may have a capacitance value in the range of 1 pF to 25 pF, though different values may be used depending on the application of amplifier 200. During operation of amplifier 200, capacitor 218 and inductor 217 can be configured to resonate at twice the f0 of device 200, causing resonator 216 to operate as a low impedance (e.g., a short circuit) for signals having a frequency of 2*f0. Resonator 216, when operating as a 2*f0 resonator, operates to improve overall performance of amplifier 200 by providing improved wave shaping and isolation of external circuit harmonics.

Capacitor 219 is a virtual capacitive component connected between combining node 170 and a ground reference node and represents the distributive parasitic capacitance of the amplifier 200 package and a carrier package lead.

Capacitor 220 is connected between package lead 202 and a ground reference node to form a low impedance baseband termination that includes effective inductances 205 and 203a and capacitor 220. The low impedance baseband termination is connected to node 206 located between inductance 205 and resonant circuitry formed by capacitor 208 and inductance 209.

In a typical application of amplifier 200, the inductance value of inductor 203a and capacitance value of capacitor 220 are selected to provide baseband termination with relatively low impedance at selected frequencies. Additionally, by placing capacitor 220 close to the active die that includes transistor 136, the video bandwidth (VBW) of output network 240 may be widened. In various embodiments, this configuration may allow capacitor 220 to be positioned within 50 -100 millimeters (mm) (in a specific embodiment, the distance may be about 70 mm) away from transistor 136, as compared to conventional devices in which the distance between an amplifier transistor and components of the transistor's output matching network may be as great as 300 mm or greater. In this configuration, node 206 may act as a baseband frequency cold point at frequencies at which the baseband termination has a low impedance (e.g., at baseband frequencies) and may act as an RF cold point at frequencies at which the parallel resonant circuit has a low impedance seen from node 206. Baseband frequencies may, for example, include any frequency between DC and 1.5 gigahertz (GHz). A cold point is a node that acts as a virtual ground for signals at selected frequencies. As used here, "virtual ground" refers to a path by which signals (in this case, RF or baseband signals at the selected frequencies) may be routed to ground due to the low impedance between the cold point and the ground-plane (e.g., due to the low impedance of the baseband termination at the selected frequencies). By connecting the baseband termination circuit to the RF cold point at node 206 this may minimize RF leakage through the baseband circuit. The values selected for the inductance and capacitance are further chosen so that leakage of RF energy for RF signals oscillating at the fundamental frequency may be minimized. VBW generally refers to the maximum signal bandwidth that an amplifier or transmitter system may process whilst complying with system defined constraints for interference levels.

In some embodiments, capacitor 220 has a relatively large capacitance that may range from 10 microfarads to 500 microfarads, though different capacitor configurations may be utilized depending on the device implementation. In this configuration, capacitor 220 may operate to terminate the carrier amplifier and has a low impedance at the carrier amplifier's baseband frequencies. It is contemplated that all or a portion of the capacitance provided by capacitor 220 may be provided by capacitive structures formed within IPD 204.

The DC voltage applied to peaking amplifier 156 by bias circuit 166 is established by the drain voltage supply 261. Drain voltage supply 261 is connected to a package lead (represented by dashed box 262) which operates as a bias feed line. Within the package lead designated by dashed box 262, inductor 263a and capacitor 263b are virtual components and represent, respectively, the inductance and the capacitance of the package lead 262.

Package lead 262 is connected to terminal 266 of IPD 264 through inductor 265. Inductor 265 represents the inductance of the electrical connection (e.g., a bond wire array) that couples package lead 262 to terminal 266 of IPD 264. A number of electrical components are formed within IPD 264. Terminal 266 of IPD 264 is connected to a resonator 267. Resonator 267 include a capacitor 268 and inductor 269 connected in parallel and formed within IPD 264. In an embodiment, capacitor 268 may have a capacitance ranging from 1 pF to 100 pF and inductor 269 may have an inductance ranging from 20 pH to 1 nH, though in various embodiments other capacitance and inductance values may be used. During operation of amplifier 200, capacitor 268 and inductor 269 resonate at f0 of device 200, causing resonator 267 to operate as a relatively high impedance or open circuit for signals having a frequency of f0. As such, resonator 267 operates as a fundamental frequency resonator to isolate the bias feeding network including drain voltage supply 261 and package lead 262 from the peaking amplification path connected to the output 157 of amplifier 156 so that the bias feeding network does not interfere with the operation of the peaking amplifier path at frequencies of or around f0. Resonator 267 may not affect DC signals and, as such, the DC signals generated by drain voltage supply 261 can pass through resonator 267 enabling DC voltage biasing of the output 157 of amplifier 156.

Resonator 267 is, in turn, connected to terminal 270 of IPD 264. Terminal 270 of IPD 264 is electrically connected to output terminal 157 of amplifier 156 through inductor 271. Inductor 271 represents the inductance of the electrical connection (e.g., a bond wire array or package lead) that couples terminal 270 to terminal 157.

IPD 264 further includes inductor 272 and capacitor 273 formed within IPD 264. Capacitor 273 is connected between terminal 270 of IPD 264 and combining node 170 through terminal 274 of IPD 264, inductor 275, transmission line 290 and capacitor 291. Inductor 272 may have a value in a range between about 0.02 nH to 1 nH, and capacitor 273 may have a value in a range between about 1 pF-100 pF, although the capacitance and inductance values may be lower or higher, in other embodiments. Inductor 275 represents the inductance of the electrical connection (e.g., a bond wire array) that couples terminal 274 to transmission line 290. Inductor 272 is connected between a second terminal of capacitor 273 and a ground reference node in a shunt arrangement.

By incorporating series capacitor 273 into IPD 264, tolerances in the capacitance value of capacitor 273 can be improved as compared to implementations in which capacitor 273 is provided by a discrete capacitor component incorporated into the amplifier. Additionally, by incorporating capacitor 273 into IPD 264, capacitor 273 can be brought into closer proximity to the output of amplifier 156 enabling capacitor 273 to have a higher capacitance value while still providing adequate and appropriate output matching. In various embodiments, this configuration may allow capacitor 273 to be positioned within 50-100 millimeters (mm) (in a specific embodiment, the distance may be about 70 mm) away from amplifier 156, as compared to conventional devices in which the distance between an amplifier transistor and components of the transistor's output matching network may be as great as 300 mm or greater. Because capacitor 273 in this implementation may have a higher capacitance value than in conventional configurations, capacitor 273 may be easier to fabricate than discrete capacitors implementation, in which the discrete components may require a capacitance around 10 time less that the present IPD-based implementation. Such discrete components having relatively low capacitance are generally difficult to manufacture accurately and consistently. Accordingly, by enabling a higher capacitance value of capacitor 273 integrated into IPD 264 as compared to conventional solutions, more accurate output matching may be achieved in the present amplifier 200.

In some embodiments, amplifier 200 may further include an optional second harmonic frequency resonator 276 connected to output 135 of amplifier 159. Resonator 217 includes an inductor 217 (e.g., a bond wire array or package lead) and a capacitor 278 connected in series between output 157 and a ground reference node. In some embodiments, capacitor 268 may be provided as a discrete capacitor component, or could be implemented as a capacitive structure within IPD 264. Capacitor 268, in some applications, may have a capacitance value in the range of 1 pF to 25 pF, though different values may be used depending on the application of amplifier 200. During operation of amplifier 200, capacitor 278 and inductor 277 can resonate at twice the f0 of device 200, causing resonator 276 to operate as a low impedance (e.g., a short circuit) for signals having a frequency of 2*f0. Resonator 276, when operating as a 2*f0 resonator, operates to improve overall performance of amplifier 200 by providing improved waveshaping and isolation of external circuit harmonics.

Capacitor 279 is a virtual component connected between combining node 170 and a ground reference node and represents the distributive parasitic capacitance of the amplifier 200 package and the carrier package lead.

Capacitor 280 is connected between package lead 262 and a ground reference node to form a low impedance baseband termination that includes effective inductances 265 and 263a and capacitor 280. The low impedance baseband termination is connected to node 266 located between inductance 265 and resonant circuitry formed by capacitor 268 and inductance 269.

In a typical application of amplifier 200, the inductance value of inductor 263a and capacitance value of capacitor 280 are selected to provide baseband termination with relatively low impedance at selected frequencies. Additionally, by placing capacitor 280 close to the active die that includes transistor 156, the VBW of output network 260 may be widened. In various embodiments, this configuration may allow capacitor 280 to be positioned within 50-100 millimeters (mm) (in a specific embodiment, the distance may be about 70 mm) away from transistor 156, as compared to conventional devices in which the distance between an amplifier transistor and components of the transistor's output matching network may be as great as 300 mm or greater. In this configuration, node 266 may act as a baseband frequency cold point at frequencies at which the baseband termination has a low impedance (e.g., at baseband frequencies) and may act as an RF cold point at frequencies at which the parallel resonant circuit has a low impedance seen from node 266. Baseband frequencies may, for example, include any frequency between DC and 1.5 GHz. By connecting the baseband termination circuit to the RF cold point at node 266 this may minimize RF leakage through the baseband circuit. The values selected for the inductance and capacitance are further chosen so that leakage of RF energy for RF signals oscillating at the fundamental frequency may be minimized.

In some embodiments, capacitor 280 has a relatively large capacitance that may range from 10 microfarads to 500 microfarads, though different capacitor configurations may be utilized depending on the device implementation. In this configuration, capacitor 280 may operate to terminate the carrier amplifier and has a low impedance at the carrier amplifier's baseband frequencies. It is contemplated that all or a portion of the capacitance provided by capacitor 220 may be provided by capacitive structures formed within IPD 264.

The carrier and peaking output circuits 240, 260 are configured to establish the desired electrical lengths 144, 164 discussed above with respect to FIG. 1. According to an embodiment, carrier output circuit 240 comprises inductor 211, capacitor 213, and inductor 215, electrically coupled in series between the carrier amplifier output 137 and the combining node 170. For example, the series inductor 211 may represent the inductance of various conductive structures (e.g., bond wire arrays) between the carrier amplifier output 137 and terminal 210 of IPD 204, which is electrically coupled to capacitor 213. Similarly, inductor 215 may represent the inductance of various conductive structures (e.g., bond wire arrays and/or package lead) between terminal 214 of IPD (which is electrically coupled to capacitor 213) and combining node 170.

Inductor 211, capacitor 213, and inductor 215 form portions of a carrier output matching network (OMN), which is configured to further increase the circuit impedance toward the load impedance. According to an embodiment, the carrier OMN may further include one or more shunt passive elements, such as capacitor 212.

Similarly, and according to a further embodiment, peaking output circuit 260 comprises inductor 271, capacitor 273, inductor 275, transmission line 290 and capacitor 291 electrically coupled in series between the peaking amplifier output 157 and the combining node 170. For example, the series inductor 271 may represent the inductance of various conductive structures (e.g., bond wire array) between the peaking amplifier output 157 and terminal 270 of IPD 264, which is electrically coupled to capacitor 273. Similarly, inductor 275 may represent the inductance of various conductive structures (e.g., bond wire array and/or package lead) between terminal 274 of IPD (which is electrically coupled to capacitor 23) and transmission line 290.

Inductor 271, capacitor 273, inductor 275, transmission line 290, and capacitor 291 form portions of a carrier output matching network (OMN), which is configured to further increase the circuit impedance toward the load impedance. According to an embodiment, the carrier OMN may further include one or more shunt passive elements, such as inductor 272.

At peak power, carrier OMN 240 should match the complex impedance 2*ZL to the optimal load impedance, Ropt, and at backoff condition match the complex impedance ZL to optimal load impedance Rmod. Peaking OMN 260 should transform the complex impedance (2*ZL) to Ropt at peak power, and at backoff, it should be transparent (i.e., looking into OMN 260 from node 170, the impedance should emulate an open circuit so as not to load the combining node 170). Accordingly, at backoff, OMN 260 should provide open-to-open, and thus have an electrical length of 0 degrees or 180 degrees.

Referring again to FIG. 1, the above-described configurations provide correct phase relationships for optimal load modulation, and provide that the amplified signals from the carrier and peaking paths 130, 150 arrive in phase (or coherently) at the combining node 170. Combining node 170 includes a conductive structure that is suitable for combining the amplified RF signals produced by the carrier and peaking amplification paths 130, 150.

According to an embodiment, a complex combining load matching circuit 180 (i.e., a circuit providing a resistive component and a reactive component) is coupled between the combining node 170 and the RF output 190. According to an embodiment, the complex combining load matching circuit 180 provides or presents a complex combining load impedance, ZL, to the combining node 170 that can be represented as:

$$ZL=R(1+/-jxn), \quad \text{(Eqn. 1)}$$

where R is a load resistance value (free design variable, such as 10-100 ohms, or some other value), and xn is the normalized value of the reactive portion of the complex impedance, or the normalized load reactance. In other words, the complex combining load impedance provided or presented by the complex combining load matching circuit 180 has a reactive portion, xn.

Essentially, the complex combining load matching circuit 180 transforms the impedance ZL to the impedance of load 106 (e.g., 50 ohms). The value of xn is non-zero, in an embodiment (otherwise the complex combining load matching circuit 180 would result in a real load characterized only by a real impedance). In other words, according to an embodiment, the load impedance, ZL, is complex (i.e., the load impedance has a non-zero reactive portion). According to more specific embodiments, the normalized load reactance, xn, has an absolute value in a range of about 0.1 to about 5.3, which supports input phase offsets in a range of about 20 degrees to about 160 degrees. In another embodiment, the normalized load reactance, xn, has an absolute value in a range of about 1.0 to about 2.0 (e.g., 1.291, or other values within this range). An embodiment of the complex combining load matching circuit 180 is implemented with first and second transmission line segments connected in series between the combining node 170 and the RF output 190.

The design output backoff (OBO) determines the required value of the normalized load reactance, xn, presented to combining node 170 by the complex combining load matching circuit 180 as follows:

$$xn=\pm\sqrt{(\beta-2)(2\beta-1)/\beta}, \quad \text{(Eqn. 2)}$$

where is the load modulation range (e.g., in a range of about 2.2 to about 40, although the load modulation range may be lower or higher), and $$\beta = 10^{\left(\frac{OBO}{10}\right)}/2 \quad \text{(Eqn. 3)}$$

Further, as mentioned above, the electrical length 144, $\theta_x$, of the carrier output circuit 140 is mathematically derived from the value of the load impedance presented or provided to the combining node 170 by the complex combining load matching circuit 180. In other words, the complex impedance, ZL, generated by the complex combining load matching circuit 180 determines the input phase offset. More specifically, the value of $\theta_x$ is derived from the normalized load reactance, xn, as follows:

$$\theta x=\pi-\tan^{-1}[(2\beta-1)/(\beta x_n)] \text{ for positive values of } xn \quad \text{(Eqn. 4)}$$

$$\text{or } \tan^{-1}[(2\beta-1)/(\beta x_n)] \text{ for negative values of } xn$$

As indicated above, the input phase offset at the carrier and peaking path inputs 133, 153, which is dependent upon the electrical length of phase shifters 132, 152 (or input offset lines) (e.g., 0 degrees, $\theta_x$ degrees, or n*180 degrees−$\theta_x$ degrees), is in a range from about +/−20 degrees to about +/−160 degrees (i.e., the input phase offset corresponds to a phase difference of +/−20 degrees to +/−160 degrees between the carrier and peaking input RF signals at the carrier and peaking path inputs 133, 153). For example, when xn=+1.291 (i.e., ZL=R(1+j1.291), the electrical length 144, $\theta_x$, of the carrier output circuit 140 equals about 127 degrees, and the corresponding input phase offset at the peaking path input 153 with respect to carrier path input 133 equals about −127 degrees. Said another way, when the peaking phase shifter 152 (or input offset line) has an electrical length of 127 degrees, this results in a corresponding input phase offset of −127 degrees at the peaking path input 153 with respect to the carrier path input 133.

Those of skill in the art understand that, during operation of a Doherty amplifier, a first efficiency peak occurs at backoff power, and a second efficiency peak occurs at saturation power. Essentially, the output backoff (OBO) is the difference (in decibels (dB)) between the first and second efficiency peaks. For a conventional symmetric Doherty amplifier with a real load (i.e., xn=0), the OBO is about 6 dB. Conversely, in accordance with various embodiments, implementation of a complex combining load matching circuit providing a normalized load reactance, xn, with an absolute value in a range of about 0.1 to about 5.3 may support OBO levels from about 6 decibels (dB) to about 15 dB for a symmetric or substantially symmetric Doherty amplifier 100. According to the above-given example when xn=+1.291 (i.e., ZL=R(1+j1.291), for example, the OBO is about 7.8 dB. Essentially, the larger the normalized load reactance, xn, the deeper the backoff peak (i.e., the larger the OBO).

The complex combining load matching circuit 180 is connected to RF output 190, which in turn is connected to antenna 106, in an embodiment. In a physical implementation of Doherty amplifier 100, RF output 190 may be implemented, for example, with a 50 ohm transmission line and an RF output connector.

Figure 2:
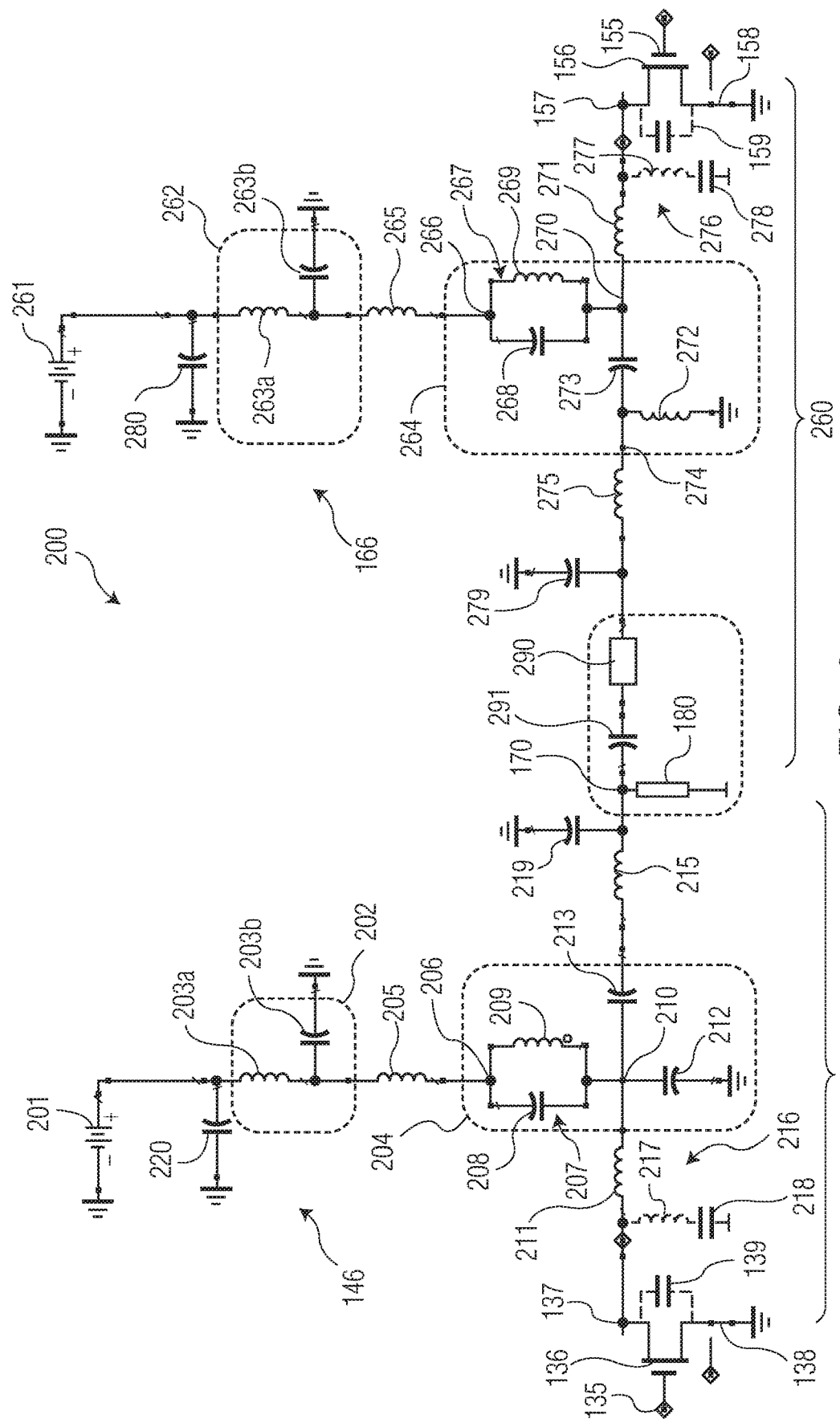
FIG. 2 is a generalized schematic representation of carrier and peaking output matching networks for a Doherty power amplifier, in accordance with an example embodiment.
Figure 3:
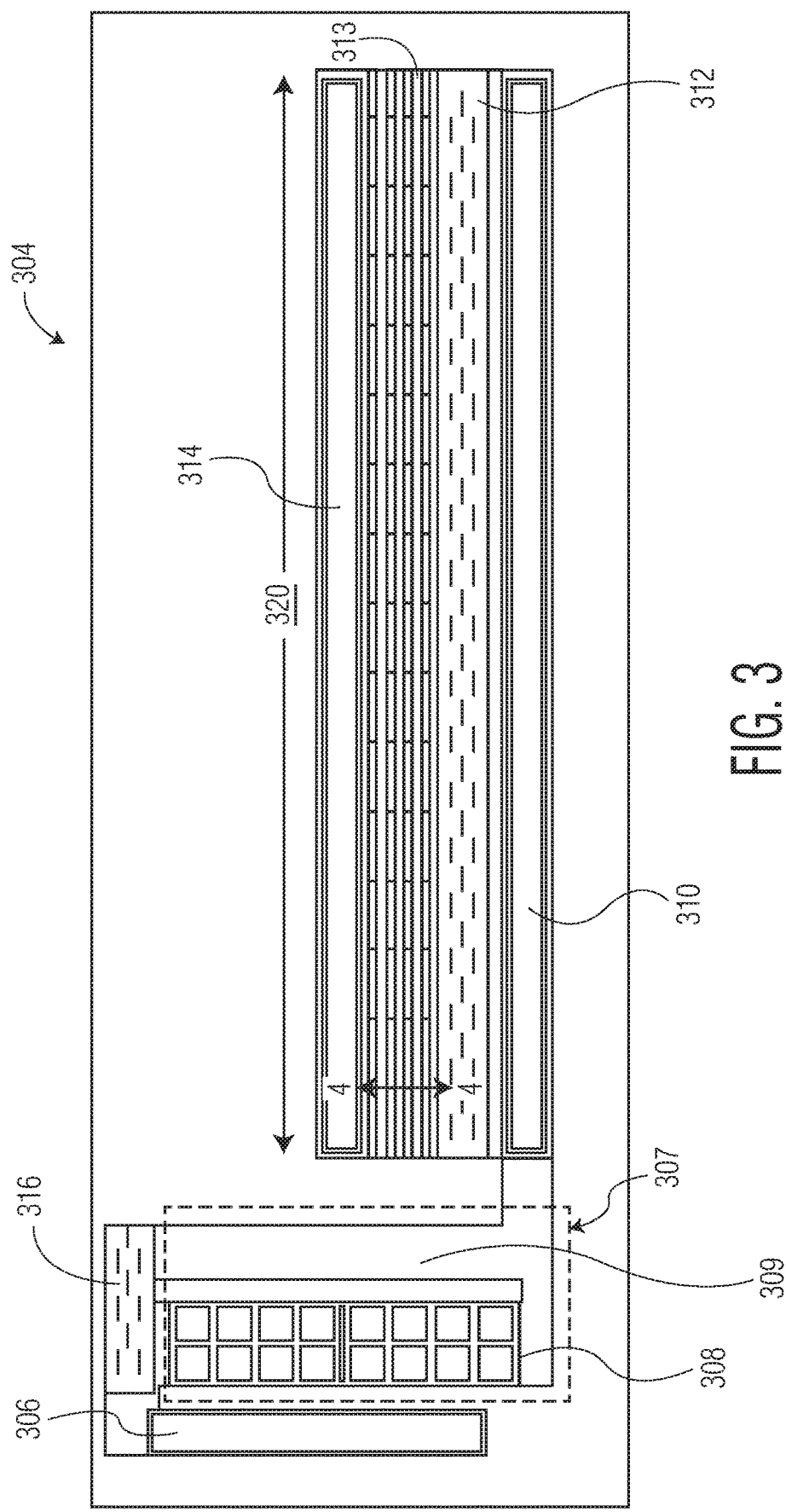
FIG. 3 is a top view of a IPD that includes components of an output impedance matching circuit of a carrier amplification path of a Doherty amplifier.

FIG. 3 is a top view of an IPD 304 (e.g., a physical implementation of output-side IPD 204 of FIG. 2) that includes components of an output impedance matching circuit (e.g., components of output matching network 240, FIG. 2), in accordance with an example embodiment. For enhanced understanding, FIG. 3 should be viewed in parallel with FIG. 4, which is a cross-sectional, side view of capacitor structure 313 formed within IPD 304 along line 4-4.

According to an embodiment, IPD 304 includes components corresponding to two capacitors—series capacitor 313 (e.g., capacitor 213 of FIG. 2) and shunt capacitor 312 (e.g., capacitor 212 of FIG. 2) and resonator 307 (e.g., resonator 207 of FIG. 2), delineated by the dashed box in FIG. 3, comprising capacitor 308 (e.g., capacitor 208 of FIG. 2) and inductor 309 (e.g., inductor 209 of FIG. 2). More particularly, in an embodiment, capacitors 312, 313, and resonator 307 are integrally formed in IPD 304. Each of capacitors 312, 313, and 308 may be implemented as metal-insulator-metal (MIM) capacitors within IPD 304.

IPD 304 includes a semiconductor substrate (not shown) in FIG. 3. The substrate may be formed from any of a variety of semiconductor materials, including but not limited to silicon (including silicon-on-insulator, silicon-on-sapphire, and other silicon-based composite substrates), gallium arsenide (GaAs), gallium nitride (GaN, including GaN-on-silicon, and other GaN-based composite substrates), and so on. A plurality of conductive layers and insulating layers (collectively referred to as "build-up layers") are formed over the top surface of the substrate to form the structure of capacitors 308, 312, and 313 and inductor 307. The insulating layers function to selectively electrically isolate the conductive layers. A ground reference node (e.g., a conductive layer) is provided at a bottom surface of IPD 304, in an embodiment, and one terminal of shunt capacitor 312 may be connected to the ground reference node using through substrate vias that extend from the plurality of build-up layers through the semiconductor substrate to the bottom surface. When the IPD 304 is integrated into a device (e.g., connected to conductive substrate 701 of package 630, FIG. 7), the ground reference node of the IPD 304 is connected to a ground reference node of the device (and ultimately a ground reference of the amplifier).

Capacitor 312 may have a value in a range between about 1 pF to 100 pF, and capacitor 313 may have a value in a range between about 1 pF to 100 pF, although the capacitance values may be lower or higher, in other embodiments. Within resonator 307, inductor 309 may have a value in a range between about 20 pH and 1000 pH and capacitor 308 may have a value in a range between about 1 pF to 100 pF, although the inductance value may be lower or higher, in other embodiments.

In some embodiments of IPD 304, an additional shunt capacitor 316 is provided. If included, shunt capacitor 316 is connected between resonator 307 and contact pad 306 and provides improved RF cold point performance and RF isolation. In some applications, capacitor 316 may have a value in a range between about 1 pF to 100 pF, although the capacitance values may be lower or higher, in other embodiments. If shunt capacitor 316 is not incorporated into IPD 304, resonator 307 may be connected directly to contact pad 306.

Figure 4:
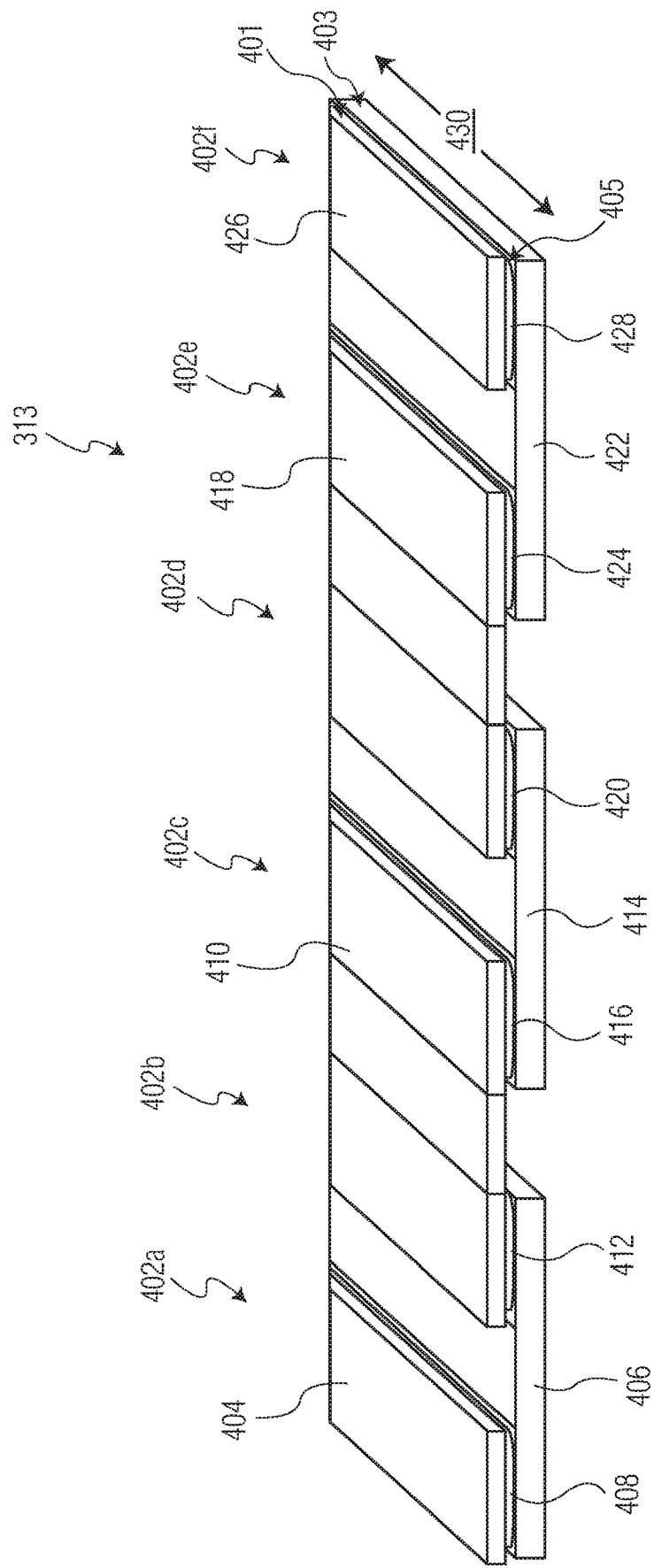
FIG. 4 is a cross-sectional view of a portion of the IPD depicted in FIG. 3.

In various embodiments, series capacitor 312 may include a number of smaller capacitors connected together in series to form the capacitor structure that is capacitor 312. To illustrate, FIG. 4 shows a partial cross-sectional view of capacitor 312 taken along line 4-4 of FIG. 3. As illustrated, capacitor 313 is made up of a number of capacitors 402a-402f that are formed by a combination of conductive layers separated by an insulating layer. Specifically, a top conductive layer 401 of capacitor structure 313 is patterned to form a number of top plates of the various capacitors 402a-402f. Bottom conductive layer 403 is patterned to form a number of bottom plates of the various capacitors 402a-402f. Insulating layer 405 is similarly patterned to form the dielectric portion of each of capacitors 402a-402f. The cross-sectional view shown in FIG. 4 does not illustrate the substrate of IPD 304.

As illustrated, each of the individual capacitors 402a-402f are connected in series to form capacitor 313. Specifically, region 404 of conductive layer 401 forms the top plate of capacitor 402a. Region 406 of conductive layer 403 forms the bottom plate of capacitor 402a, with region 408 of insulating layer 405 being disposed between the top plate and the bottom plate.

Region 406 of conductive layer 403 extends to form the bottom plate of capacitor 402b, connecting capacitor 402a and 402b in series. Region 410 of conductive layer 401 forms the top plate of capacitor 402b with region 412 of insulating layer 405 being disposed between the top plate and the bottom plate of capacitor 402b.

Region 410 of conductive layer 401 extends to form the top plate of capacitor 402c, connecting capacitor 402b and 402c in series. Region 414 of conductive layer 403 forms the bottom plate of capacitor 402c with region 416 of insulating layer 405 being disposed between the top plate and the bottom plate of capacitor 402c.

Region 414 of conductive layer 403 extends to form the bottom plate of capacitor 402d, connecting capacitor 402c and 402d in series. Region 418 of conductive layer 401 forms the top plate of capacitor 402d with region 420 of insulating layer 405 being disposed between the top plate and the bottom plate of capacitor 402d.

Region 418 of conductive layer 401 extends to form the top plate of capacitor 402e, connecting capacitor 402d and 402e in series. Region 422 of conductive layer 403 forms the bottom plate of capacitor 402e with region 424 of insulating layer 405 being disposed between the top plate and the bottom plate of capacitor 402e.

Region 422 of conductive layer 403 extends to form the bottom plate of capacitor 402f, connecting capacitor 402e and 402f in series. Region 426 of conductive layer 401 forms the top plate of capacitor 402f with region 428 of insulating layer 405 being disposed between the top plate and the bottom plate of capacitor 402f.

In this configuration, regions 404 and 426 of conductive layer 401 form the first and second terminals of the capacitor structure making up capacitor 313. Although in this embodiment, capacitor 313 is shown as including six sub-capacitor structures (i.e., capacitors 402a-402f), it should be understood that capacitor 313 could be formed in this manner using any number of individual capacitors and is not limited to six.

Within capacitor 313, each individual sub-capacitor 402a-402 extends across the width of capacitor 313. In FIG. 4, line 430 shows the direction in which the widths of capacitors 402a-402f is to be measured, even though FIG. 4 does not show the entire width of each of capacitors 402a-402f. In FIG. 3, line 320 shows the direction in which the width of capacitor 313 is to be measured.

In the configuration of capacitor 313 shown in FIG. 4, because each of capacitors 402a-402f are connected in series, the total capacitance of capacitor 313 is less than the individual capacitance of capacitors 402a-402f that may up capacitor structure 313. The larger capacitances of capacitors 402a-402f can be easier and more accurate to fabricate within an IPD, enabling better control of the overall capacitance value of capacitor structure 313. Accordingly, in embodiments where the target capacitance of capacitor structure 313 ranges from 3 pF to 4 pF, a relatively small capacitance, the capacitances of capacitors 402a-402f may ranges from 10 pF to 30 pF or from 18 pF to 24 pF, capacitance values that are larger and easier to achieve accurately with the IPD.

Referring to FIG. 3, a first terminal of capacitor 313 is connected to bond pad 314 (corresponding to terminal 214 of FIG. 2). A second terminal of capacitor 313 is connected to a first terminal of resonator 307 and is also connected to bond pad 310 (corresponding to terminal 210 of FIG. 2). Each bond pad 314, 310, and 306 is configured to accept attachment of one or more wire bond arrays.

Figure 5:
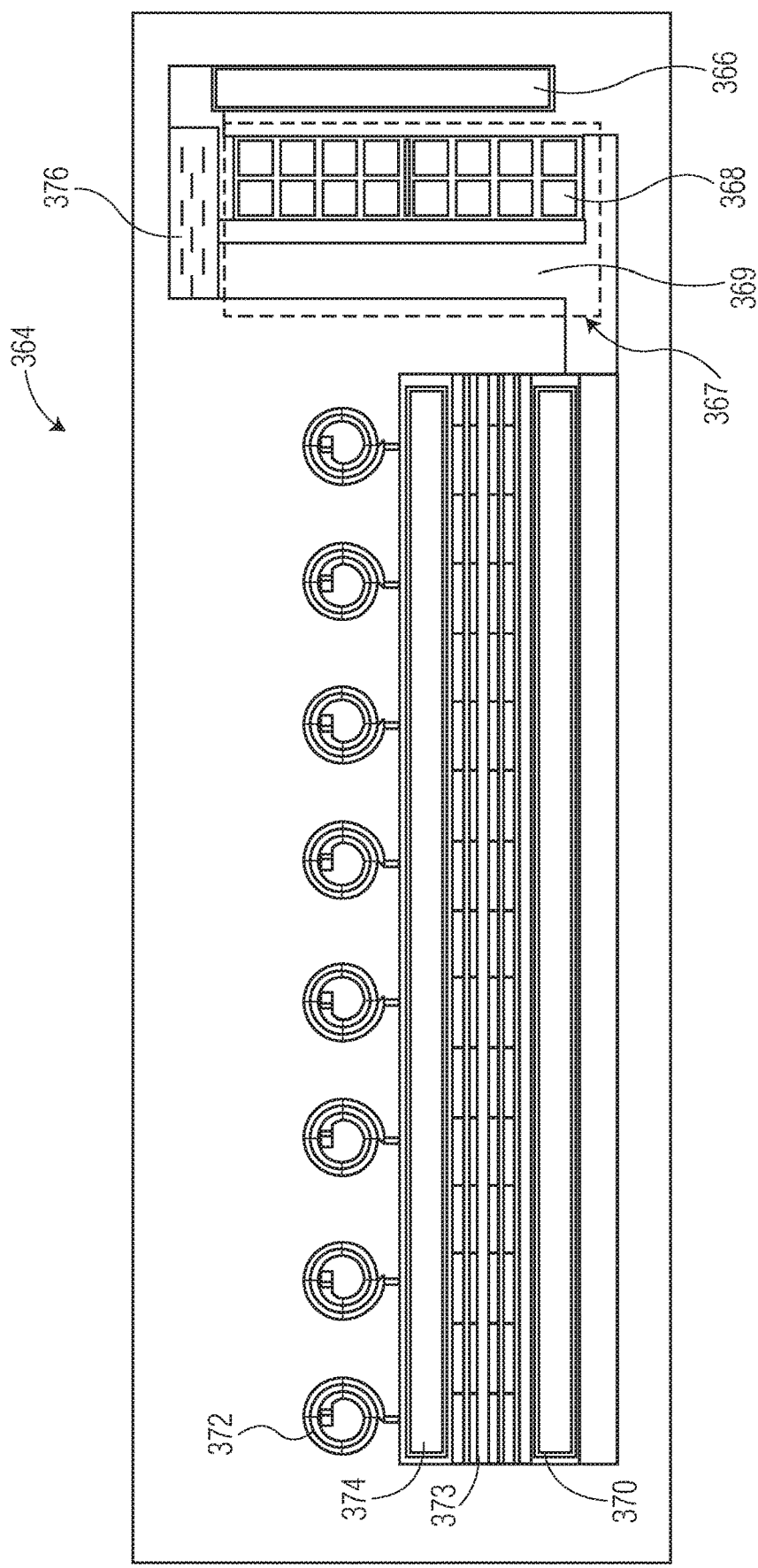
FIG. 5 is a top view of a IPD that includes components of an output impedance matching circuit of a peaking amplification path of a Doherty amplifier.

FIG. 5 is a top view of an IPD 504 (e.g., output-side IPD 204 of FIG. 2) that includes components of an output impedance matching circuit (e.g., components of output matching network 240, FIG. 2), in accordance with an example embodiment.

According to an embodiment, IPD 504 includes capacitor 373 (e.g., capacitor 273 of FIG. 2), shunt inductor 372 (e.g., inductor 272 of FIG. 2) and resonator 367 (e.g., resonator 267 of FIG. 2), delineated by the dashed box in FIG. 5, comprising capacitor 368 (e.g., capacitor 268 of FIG. 2) and inductor 369 (e.g., inductor 269 of FIG. 2). More particularly, in an embodiment, capacitors 373, resonator 367, and inductor 372 are integrally formed in IPD 364. Each of capacitors 373 and 368 may be implemented as metal-insulator-metal (MIM) capacitors within IPD 364. Inductor 372 may be implemented as a spiral inductor within IPD 364.

IPD 364 includes a semiconductor substrate that may be formed from any of a variety of semiconductor materials, including but not limited to silicon (including silicon-on-insulator, silicon-on-sapphire, and other silicon-based composite substrates), GaAs, GaN, including GaN-on-silicon, and other GaN-based composite substrates, and so on. A plurality of conductive layers and insulating layers (collectively referred to as "build-up layers") are formed over the top surface of the substrate to form the structure of capacitors 368, 373 and inductors 369, 372. A ground reference node (e.g., a conductive layer) is provided at a bottom surface of IPD 364, in an embodiment, and one terminal of shunt inductor 372 may be connected to the ground reference node using through substrate vias that extend from the plurality of build-up layers through the semiconductor substrate to the bottom surface. When the IPD 364 is integrated into a device (e.g., connected to conductive substrate 701 of package 630, FIG. 7), the ground reference node of the IPD 364 is connected to a ground reference node of the device (and ultimately a ground reference of the amplifier).

Inductor 372 may have a value in a range between about 0.02 nH to 1 nH, and capacitor 373 may have a value in a range between about 1 pF-100 pF, although the capacitance and inductance values may be lower or higher, in other embodiments. Within resonator 367, inductor 369 may have a value in a range between about 0.02 nH-1 nH and capacitor 368 may have a value in a range between about 1 pF-10 pF, although the inductance value may be lower or higher, in other embodiments. In various embodiments, capacitor 373 may be made up a number of smaller capacitors connected together in series to form the capacitor structure that is capacitor 373. Accordingly, may have a structural configuration that is similar to that of capacitor 313 discussed above and illustrated in FIG. 4.

In some embodiments of IPD 364, an additional shunt capacitor 376 is provided. If included, shunt capacitor 376 is connected between resonator 367 and contact pad 366 and provides improved RF cold point performance and RF isolation. In some applications, capacitor 376 may have a value in a range between about 1 pF to 100 pF, although the capacitance values may be lower or higher, in other embodiments. If IPD 364 does not include capacitor 376, resonator may be coupled directly to contact pad 366.

A first terminal of capacitor 373 is connected to bond pad 374 (corresponding to terminal 274 of FIG. 2). A second terminal of capacitor 373 is connected to a first terminal of resonator 367 and is also connected to bond pad 370 (corresponding to terminal 270 of FIG. 2). Each bond pad 374, 370, and 366 is configured to accept attachment of one or more wire bond arrays.

Figure 6:
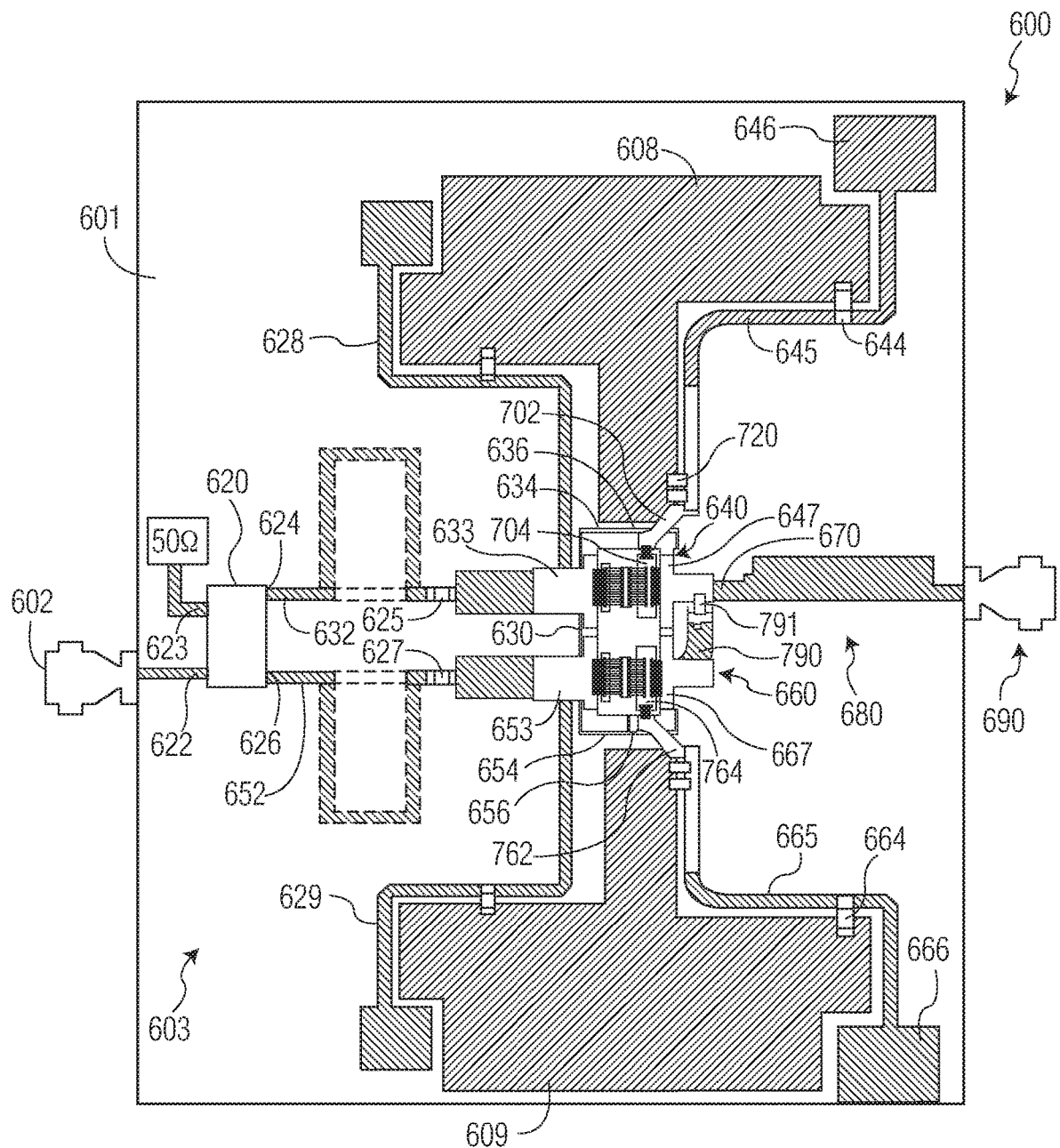
FIG. 6 is a top view of a physical implementation of a Doherty amplifier, in accordance with an example embodiment.
Figure 7:
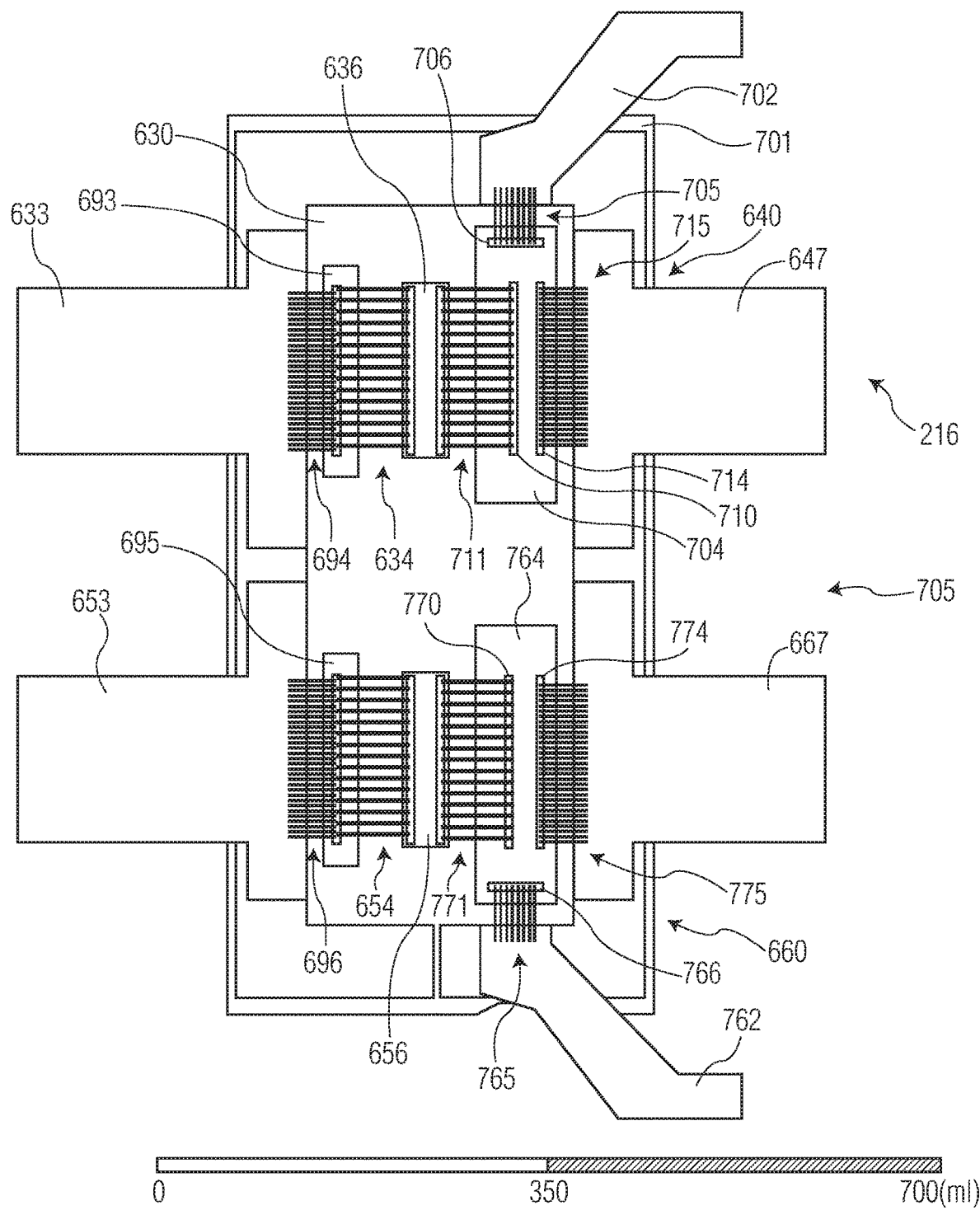
FIG. 7 is an enlarged view of a portion of the physical implementation of the Doherty amplifier of FIG. 6.

A physical implementation of Doherty amplifier 200 (FIG. 2) will now be described in conjunction with FIG. 6, which is a top view of a Doherty amplifier 600. Doherty amplifier 600 incorporates input circuitry 603 containing input matching networks that is analogous to the input circuitry 110 and input matching networks 134, 154 of Doherty amplifier 100 of FIG. 1. The components of Doherty amplifier 600 are coupled to and/or mounted on a substrate 601, such as a single-layer or multi-layer printed circuit board (PCB), for example. A patterned conductive layer on the top surface of substrate 601 includes a plurality of conductive features that function to electrically connect the various components of Doherty amplifier 600 to each other or to external voltage sources and/or voltage references (e.g., a ground reference). To facilitate understanding of FIG. 6, FIG. 7 is an enlarged view of package 630 portion of amplifier 600. Some components are labeled with element numbers in FIG. 7 where the corresponding components in FIG. 6 are not labeled to reduce the complexity of view FIG. 6. Even so, FIG. 7 should be viewed as simply showing an enlarged portion of amplifier 600 of FIG. 6 wherein the components depicted in FIG. 7 are intended to be the same as those depicted in FIG. 6.

Doherty amplifier 600 includes an input RF connector 602 (e.g., RF input 102, FIG. 1), a power splitter 620 (e.g., power splitter 120, FIG. 1), a carrier input transmission line 632, a peaking input transmission line 652, a carrier amplifier 636 (e.g., carrier amplifier 136, FIG. 1, carrier amplifier 236, FIG. 2), a peaking amplifier 656 (e.g., peaking amplifier 156, FIG. 1, peaking amplifier 356, FIG. 2), a carrier output circuit 640 (e.g., carrier output circuit 140, FIG. 1, carrier output circuit 240, FIG. 2), a peaking output circuit 660 (e.g., peaking output circuit 160, FIG. 1, peaking output circuit 240, FIG. 2), a combining node 670 (e.g., combining node 170, FIGS. 1 and 2), a complex combining load matching circuit 680 (e.g., complex combining load matching circuit 180, FIGS. 1 and 2), and an RF output 690 (e.g., RF output 190, FIG. 1).

Referring to the enlarged view of FIG. 7, the carrier and peaking amplifiers 636, 656 may be implemented as power transistors on one or more semiconductor dies, as mentioned previously. Together with other components, carrier and peaking amplifiers 636, 656 may be incorporated into an amplifier package 630. Input (pre-match) component 693 is mounted to a conductive substrate 701 of package 630, which serves as a ground node for the package 630 and various components contained therein. Carrier amplifier 636 (and, specifically, an input or gate terminal of carrier amplifier 636) is connected to a first terminal of input (pre-match) component 693 by bond wire array 634. A second terminal of input (pre-match) component 693 is, in turn, connected to carrier input lead 633 by bond wire array 694. Input (pre-match) component 695 is mounted to package 630. Peaking amplifier 656 (and, specifically, an input terminal or gate terminal of peaking amplifier 656) is connected to a first terminal of input (pre-match) component 695 by bond wire array 654. A second terminal of input (pre-match) component 695 is, in turn, connected to peaking input lead 653 by bond wire array 696. Input (pre-match) components 693, 695 may be configured to operate as T-match, low-pass filters that are optimized for the fundamental band at which amplifier 600 is configured to operate. Input (pre-match) components 693, 695 may include IPDs with T-match filter that include series-inductor, shunt-capacitor, and series-inductor components. In such a configuration, the shunt-capacitor is a part of the matching circuit and does not operate as a blocking cap. In typical configuration, the shunt-capacitors of input (pre-match) components 693, 695 may have capacitance values that range from 10 pF-200 pF, though in other implementations different capacitance values may be used.

IPD 704 (e.g., IPD 204 of FIG. 2) is mounted to package 630. A number of components are formed within IPD 704 so that IPD 704 forms a portion of carrier output circuit 640. Carrier amplifier 636 (and specifically an output terminal or drain terminal of carrier amplifier 636) is connected to terminal 710 of IPD 704 by bond wire array 711 (e.g., inductor 211 of FIG. 2). IPD 704 may include a series and shunt capacitor (e.g., capacitors 313, 312, respectively, of FIG. 3) that are electrically connected to terminal 710. Terminal 714 of IPD 704 (e.g., terminal 314 of FIG. 3 or terminal 214 of FIG. 2) is connected to carrier output lead or 647 by bond wire array 715 (e.g., inductor 215 of FIG. 2). In this manner carrier output lead 647 operates as combining node 670 and is the physical structure of amplifier 300 that is analogous to the complex combining node 170 shown in FIGS. 1 and 2.

IPD 704 also includes terminal 706 (e.g., terminal 306 of FIG. 3 or terminal 206 of FIG. 2), which may be connected to a resonator (e.g., resonator 307 of FIG. 3 or resonator 207 of FIG. 2) formed within IPD 704. Terminal 706 is connected to a package lead 702 (e.g., package lead 202 of FIG. 2) by bond wire array 705 (e.g., inductor 205 of FIG. 2). Package lead 702 is connected to capacitor 720 (e.g., capacitor 220, FIG. 2), which is, in turn, connected to ground node 608. Capacitor 720 provides baseband termination to amplifier 600.

IPD 764 (e.g., IPD 264 of FIG. 2) is mounted to package 630. A number of components are formed within IPD 764 so that IPD 764 forms a portion of peaking output circuit 660. Peaking amplifier 656 (and, specifically, and output terminal or drain terminal of peaking amplifier 656) is connected to terminal 770 of IPD 764 by bond wire array 771 (e.g., inductor 271 of FIG. 2). IPD 764 may include a series capacitor (e.g., capacitor 373 of FIG. 5 or capacitor 273 of FIG. 2) and a shunt inductor (e.g., inductor 372 of FIG. 3 or inductor 272 of FIG. 2) that are electrically connected to terminal 770 (e.g., contact pad 370 of FIG. 3 or terminal 270 of FIG. 2). Terminal 774 of IPD 764 (e.g., contact pad 374 of FIG. 5 or terminal 274 of FIG. 2) is connected to peaking output lead or 667 by bond wire array 775 (e.g., inductor 275 of FIG. 2).

IPD 764 also includes terminal 766 (e.g., contact pad 366 of FIG. 5 or terminal 266 of FIG. 2), which may be connected to a resonator (e.g., resonator 367 of FIG. 5 or resonator 267 of FIG. 2) formed within IPD 764. Terminal 766 is connected to a package lead 762 (e.g., package lead 262 of FIG. 2) by bond wire array 765 (e.g., inductor 265 of FIG. 2). Package lead 762 is connected to capacitor 780 (e.g., capacitor 280, FIG. 2), which is, in turn, connected to ground reference node 609. Capacitor 780 provides baseband termination to amplifier 600.

Referring to FIGS. 6 and 7, peaking output lead 667 is connected to transmission line 790 (e.g., transmission line 290 of FIG. 2), which is formed on a surface of substrate 601. In various embodiments, the geometry (e.g., length, width, thickness, and shape) of transmission line 790 may be adjusted so that an impedance of transmission line 790 satisfies operational requirements of amplifier 600. Transmission line 790 may be formed as a single-section transmission line element upon substrate 601. Transmission line 790 is, in turn connected to capacitor 791 (e.g., capacitor 291 of FIG. 2) which is, in turn, connected to carrier output lead 647, which operates as combining node 770 of amplifier 600.

Package 630 may be coupled to the substrate 601 in a manner that provides a ground reference to the amplifiers 636, 656, and which also provides a heat sink for thermal energy generated by the amplifiers 636, 656, during operation. For example, the substrate 301 may include a conductive coin or thermal vias, and the amplifier package 630 may be coupled to the substrate 601 over the conductive coin or thermal vias.

The input RF connector 602 is electrically coupled to an input 622 (or a first port) of the power splitter 620. For example, a conductive trace or transmission line on the substrate 601 may electrically connect the input RF connector 602 to input 622 (e.g., input 122, FIG. 1) of the power splitter 620. A second port 623 of the power splitter 620 may be coupled to a 50 ohm termination to ground. The power splitter 620 may be a discretely-packaged component mounted to the surface of substrate 601, in one embodiment, or may be implemented using conductive traces on the substrate 601. Either way, the power splitter 620 is configured to divide the power of the input RF signal received at power splitter input 622 into carrier and peaking portions of the input signal (i.e., the carrier input RF signal and the peaking input RF signal). The carrier input RF signal is provided to the carrier amplification path at power splitter output 624 (or a third port, e.g., splitter output 124, FIG. 1), and the peaking input RF signal is provided to the peaking amplification path at power splitter output 626 (or a fourth port, e.g., splitter output 126, FIG. 1).

The carrier input RF signal is conveyed to an input (e.g., gate terminal) of the carrier amplifier 636 through carrier input transmission line 632 and DC blocking capacitor 625, and the peaking input RF signal is conveyed to an input (e.g., gate terminal) of the peaking amplifier 656 through peaking input transmission line 652 and DC blocking capacitor 627.

According to an embodiment, each of the carrier and peaking input transmission lines 632, 652 may serve the functionality of a phase shifter (e.g., phase shifters 132, 152, FIG. 1) by having an electrical length that imparts a desired input phase offset between the carrier and peaking input signals at the inputs to the carrier and peaking amplifiers 636, 656. For example, the electrical length of each of the carrier and peaking input transmission lines 632, 652 may be established by designing each of the transmission lines to have a physical length that corresponds, at the center operational frequency of the amplifier 600, to the desired electrical length of the transmission line 632, 652. As indicated above, the carrier input transmission line 632 may have an electrical length of 0 degrees or n*180 degrees−θ, and the electrical length of the peaking input transmission line 652 may have an electrical length of $θ_x$ or zero degrees, in various embodiments. In FIG. 6, portions of the carrier and peaking input transmission lines 632, 652 are shown with dashed lines to indicate different potential electrical lengths of the lines.

Gate bias circuits 628, 629 may be included to enable gate bias voltages to be provided to the inputs (e.g., gate terminals) of amplifiers 636, 656. In addition, drain bias circuits 646, 666 (e.g., drain bias circuits 146, 166, FIG. 1) are connected to package leads 702, 762 and may be included to enable drain bias voltages to be provided to the outputs (e.g., drain terminals) of amplifiers 636, 656. Each of the bias circuits 628, 629, 646, 666 may be connected to external voltage sources, which are configured to provide the desired bias voltages.

According to an embodiment, within package 630, input-side bond wire arrays 634, 654, input impedance components, 693, 695, bond wire arrays 694, 696, and the inputs (e.g., gate terminals) of the carrier and peaking amplifiers 636, 656 form inductive portions of carrier and peaking input matching networks (e.g., IMNs 134, 154, FIG. 1). The input matching networks may include other components (e.g., shunt capacitors, and so on), as well.

According to an embodiment, the carrier output circuit 640 also includes a shunt passive component 645 (e.g., shunt component 145, FIG. 1) electrically connected to package lead 702. Although the shunt passive component 645 may form a portion of a distinct circuit, in the embodiment illustrated in FIG. 6, the shunt passive component 645 is provided by a portion of the carrier drain bias circuit 646. More specifically, the shunt passive component 645 is provided by a portion of a feed line of the bias circuit 646 (e.g., a drain feed) that extends between impedance transformation element 642 and a feed line shunt capacitor 644. As shown in FIG. 6, the feed line shunt capacitor 644 is electrically connected between the feed line and ground reference node 608. The electrical length of the feed line (specifically the electrical length of the line between package lead 702 and capacitor 644) determines whether the shunt passive component 645 emulates a shunt inductance or a shunt capacitance. Because capacitor 644 can be placed anywhere along the feed line, the electrical length of the feed line can be altered to emulate a shunt inductance or a shunt capacitance having a desired inductance or capacitance value, according to an embodiment. More specifically, when the capacitor 644 is positioned so that the electrical length of the feed line between package lead 702 and capacitor 644 is less than 90 degrees at the center operational frequency of amplifier 600, the shunt passive component 645 emulates a shunt inductance (e.g., having an inductance value in a range of about 1.0 nH to about 5.0 nH). Conversely, when the capacitor 644 is positioned so that the electrical length of the feed line between the package lead 702 and capacitor 644 is greater than 90 degrees at the center operational frequency of amplifier 600, the shunt passive component 645 emulates a shunt capacitance (e.g., having a capacitance value in a range of about 0.1 pF to about 10 pF).

According to an embodiment, an electrical length of the carrier output circuit 640 (e.g., electrical length 144) equals about $θ_x$. As indicated previously, the electrical length of the carrier output circuit is defined by the parasitic output capacitance (e.g., drain-source capacitance 139, FIG. 1) of the final-stage transistor of the carrier amplifier 636, the series inductance of bond wire array 711, the series and shunt capacitances of IPD 704 (e.g., capacitors 212 and 213 of FIG. 2 or capacitors 312 and 313 of FIG. 3), the series inductance of bond wire array 715, and carrier output lead 647. The output circuitry also functions as an output matching network (OMN) (e.g., OMN 240, FIG. 2) between the carrier amplifier 636 and the combining node 670. As indicated in FIG. 2, various modifications could be made to the components of the carrier output circuit 640 (and by extension to the carrier OMN), such as including additional shunt capacitors and/or implementing any of a variety of T-networks, pi-networks, or hybrid T-/pi-networks.

As mentioned above, the peaking output circuit 660 includes an inductance provided by bond wire array 771, series capacitance and shunt inductance (e.g., capacitor 373 and inductor 372 of FIG. 3 or capacitor 273 and inductor 272 of FIG. 2) implemented within IPD 764, series inductance of bond wire array 775, series inductance of peaking output lead 667, series inductance of transmission line 790, and series capacitance of capacitor 791. The output circuitry also functions as an output matching network (OMN) (e.g., OMN 260, FIG. 2) between the peaking amplifier 656 and the combining node 670. As indicated in FIGS. 1 and 2, various modifications could be made to the components of the peaking output circuit 660 (and by extension to the peaking OMN), including adding an optional shunt capacitance and/or implementing any of a variety of T-networks, pi-networks, or hybrid T-/pi-networks.

According to an embodiment, the peaking output circuit 660 also includes a shunt passive component 665 (e.g., shunt component 165, FIG. 1) electrically connected to package lead 762. Although the shunt passive component 665 may form a portion of a distinct circuit, in the embodiment illustrated in FIG. 6, the shunt passive component 665 is provided by a portion of the peaking drain bias circuit 666. More specifically, the shunt passive component 665 is provided by a portion of a feed line of the bias circuit 666 (e.g., a drain feed) that extends between package lead 762 and a feed line shunt capacitor 664. As shown in FIG. 6, the feed line shunt capacitor 664 is electrically connected between the feed line and ground node 609. The electrical length of the feed line (specifically the electrical length of the line between package lead 762 and capacitor 664) determines whether the shunt passive component 665 emulates a shunt inductance or a shunt capacitance. Because capacitor 664 can be placed anywhere along the feed line, the electrical length of the feed line can be altered to emulate a shunt inductance or a shunt capacitance having a desired inductance or capacitance value, according to an embodiment. More specifically, when the capacitor 664 is positioned so that the electrical length of the feed line between package lead 762 and capacitor 664 is less than 90 degrees at the center operational frequency of amplifier 600, the shunt passive component 665 emulates a shunt inductance (e.g., having an inductance value in a range of about 1.0 nH to about 5.0 nH). Conversely, when the capacitor 664 is positioned so that the electrical length of the feed line between package lead 762 and capacitor 664 is greater than 90 degrees at the center operational frequency of amplifier 600, the shunt passive component 665 emulates a shunt capacitance (e.g., having a capacitance value in a range of about 1.0 pF to about 10 pF).

In some embodiments, both of shunt passive components 645, 665 are configured as capacitive elements, and in other embodiments, both of shunt passive components 645, 665 are configured as inductive elements. In still other embodiments, shunt passive component 645 may be configured as a capacitive element, and shunt passive component 665 may be configured as an inductive element, or vice versa.

The complex combining load matching circuit 680 (e.g., complex combining load matching circuit 180, FIG. 1) may be a complex transmission line that includes, for example, a portion of the patterned conductive layer on the top surface of the substrate 601. Complex combining load matching circuit 680 presents or provides a complex impedance, ZL, to the combining node 670 that can be represented as: $ZL=R(1+/-jxn)$.

Complex combining load matching circuit 680 is connected to RF output 690 (e.g., RF output 190, FIG. 1). According to an embodiment, RF output 690 includes a 50 ohm transmission line and an RF output connector.

The above-described embodiments include practical, compact, cost-effective, mass-producible implementations of a high power Doherty amplifier architectures, which may utilize two symmetric, substantially symmetric or slightly asymmetric carrier and peaking devices together with a complex combining load matching circuit. When compared with conventional, highly-asymmetric Doherty power amplifiers, the above-described Doherty amplifier embodiments may provide simplified power device design, reduced parasitic effects and ease of matching, and potentially higher gain and linearizable power added efficiency.

An embodiment of a Doherty power amplifier includes a device substrate, a carrier amplification path on the device substrate, wherein the carrier amplification path includes a carrier amplifier with a carrier amplifier input and a carrier amplifier output, and a peaking amplification path on the device substrate, wherein the peaking amplification path includes a peaking amplifier with a peaking amplifier input and a peaking amplifier output. The Doherty power amplifier includes input circuitry configured to provide a carrier input signal to the carrier amplifier input and to provide a peaking input signal to the peaking amplifier input, a combining node configured to combine a carrier output signal produced by the carrier amplification path with a peaking output signal produced by the peaking amplification path, and a complex combining load matching circuit connected between the combining node and an output of the Doherty amplifier. The complex combining load matching circuit provides a complex impedance to the combining node with an absolute normalized value of a reactive portion, xn, that is greater than zero. The Doherty power amplifier includes a peaking output circuit connected between the peaking amplifier output and the combining node. An electrical length of the peaking output circuit is equal to 0 degrees or n*180 degrees, where n=an integer value and the peaking output circuit includes a first integrated passive device including a first capacitor structure. The first integrated passive device includes a first contact pad coupled to the carrier amplifier output and a second contact pad coupled to the combining node. The first capacitor structure is coupled between the first contact pad and the second contact pad. The Doherty power amplifier includes a carrier output circuit connected between the carrier amplifier output and the combining node. An electrical length of the carrier output circuit, θx, is equal to an absolute value of the input phase offset when the electrical length of the peaking output circuit is 0 degrees and the carrier output circuit includes a second integrated passive device including a second capacitor structure. The second integrated passive device includes a third contact pad coupled to the carrier amplifier output and a fourth contact pad coupled to the combining node. The second capacitor structure is coupled between the third contact pad and the fourth contact pad.

In another embodiment, an amplifier includes a substrate and a package on the substrate. The package includes a carrier amplifier having a carrier amplifier input and a carrier amplifier output, a peaking amplifier having a peaking amplifier input and a peaking amplifier output, a carrier output lead, and a peaking output lead. The package includes a first integrated passive device including a first capacitor structure. The first integrated passive device includes a first contact pad coupled to the peaking amplifier output and a second contact pad coupled to the peaking output lead. The first capacitor structure is coupled between the first contact pad and the second contact pad. The package includes a second integrated passive device including a second capacitor structure. The second integrated passive device includes a third contact pad coupled to the carrier amplifier output and a fourth contact pad coupled to the carrier output lead. The second capacitor structure is coupled between the third contact pad and the fourth contact pad. The amplifier includes input circuitry configured to provide a carrier input signal to the carrier amplifier input and to provide a peaking input signal to the peaking amplifier input and a combining node configured to combine a carrier output signal from the carrier output lead with a peaking output signal from the peaking output lead.

In another embodiment, a packaged device includes a substrate, a first input lead, a second input lead, a first output lead, and a second output lead. The packaged device includes a first amplifier having a first amplifier input and a first amplifier output. The first amplifier input is coupled to the first input lead. The packaged device includes a second amplifier having a second amplifier input and a second amplifier output. The second amplifier input is coupled to the second input lead. The packaged device includes a first integrated passive device including a first capacitor structure. The first integrated passive device includes a first contact pad coupled to the first amplifier output and a second contact pad coupled to the first output lead. The first capacitor structure is coupled between the first contact pad and the second contact pad. The packaged device includes a second integrated passive device including a second capacitor structure. The second integrated passive device includes a third contact pad coupled to the second amplifier output and a fourth contact pad coupled to the second output lead. The second capacitor structure is coupled between the third contact pad and the fourth contact pad.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or detailed description.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A Doherty power amplifier, comprising:
   a device substrate;
   a carrier amplification path on the device substrate, wherein the carrier amplification path includes a carrier amplifier with a carrier amplifier input and a carrier amplifier output;
   a peaking amplification path on the device substrate, wherein the peaking amplification path includes a peaking amplifier with a peaking amplifier input and a peaking amplifier output;
   input circuitry configured to provide a carrier input signal to the carrier amplifier input and to provide a peaking input signal to the peaking amplifier input;
   a combining node configured to combine a carrier output signal produced by the carrier amplification path with a peaking output signal produced by the peaking amplification path;
   a complex combining load matching circuit connected between the combining node and an output of the Doherty amplifier, wherein the complex combining load matching circuit provides a complex impedance to the combining node with an absolute normalized value of a reactive portion, xn, that is greater than zero;
   a peaking output circuit connected between the peaking amplifier output and the combining node, wherein an electrical length of the peaking output circuit is equal to 0 degrees or n*180 degrees, where n=an integer value and the peaking output circuit includes a first integrated passive device including a first capacitor structure, the first integrated passive device including a first contact pad coupled to the carrier amplifier output and a second contact pad coupled to the combining node and wherein the first capacitor structure is coupled between the first contact pad and the second contact pad; and
   a carrier output circuit connected between the carrier amplifier output and the combining node, wherein an electrical length of the carrier output circuit, $\theta x$, is equal to an absolute value of the input phase offset when the electrical length of the peaking output circuit is 0 degrees and the carrier output circuit includes a second integrated passive device including a second capacitor structure, the second integrated passive device including a third contact pad coupled to the carrier amplifier output and a fourth contact pad coupled to the combining node and wherein the second capacitor structure is coupled between the third contact pad and the fourth contact pad.

2. The Doherty power amplifier of claim 1, wherein the output of the Doherty amplifier includes a 50 ohm transmission line and a radio frequency connector.

3. The Doherty power amplifier of claim 1, wherein the first capacitor structure includes a plurality of capacitors formed in the first integrated passive device and each capacitor in the plurality of capacitors is a metal-insulator-metal capacitor.

4. The Doherty power amplifier of claim 3, wherein a capacitance of the first capacitor structure is between 3 picofarads and 4 picofarads and a capacitance of each capacitor in the plurality of capacitors is between 10 picofarads and 30 picofarads.

5. The Doherty power amplifier of claim 1, wherein the second integrated passive device includes a third capacitor structure and the third capacitor structure is coupled between a first node of the second capacitor structure and a first ground potential node.

6. The Doherty power amplifier of claim 5, wherein the first integrated passive device includes a first inductor structure and the first inductor structure is coupled between a first node of the first capacitor structure and a second ground potential node.

7. The Doherty power amplifier of claim 6, further comprising:
   a first 2*f0 resonator coupled between the peaking amplifier output and a first ground potential node; and
   a second 2*f0 resonator coupled between the carrier amplifier output and a second ground potential node.

8. The Doherty power amplifier of claim 1, further comprising a first bias circuit coupled to the peaking amplifier output, wherein the first bias circuit includes a first bias feed line and wherein the first integrated passive device includes a first fundamental frequency resonator coupled to the first bias feed line and the first fundamental frequency resonator includes a first capacitor and a first inductor connected in parallel.

9. The Doherty power amplifier of claim 8, further comprising a second bias circuit coupled to the carrier amplifier output, wherein the second bias circuit includes a second bias feed line and wherein the second integrated passive device includes a second fundamental frequency resonator coupled to the second bias feed line and the second fundamental frequency resonator includes a second capacitor and a second inductor connected in parallel.

10. The Doherty power amplifier of claim 1, wherein the peaking output circuit includes:

a single-section transmission line element coupled to the second contact pad of the first integrated passive device; and
a third capacitor coupled between the single-section transmission line element and the combining node.

11. An amplifier, comprising:
a substrate;
a package on the substrate, the package including:
   a carrier amplifier having a carrier amplifier input and a carrier amplifier output,
   a peaking amplifier having a peaking amplifier input and a peaking amplifier output,
   a carrier output lead,
   a peaking output lead,
   a first integrated passive device including a first capacitor structure, the first integrated passive device including a first contact pad coupled to the peaking amplifier output and a second contact pad coupled to the peaking output lead and wherein the first capacitor structure is coupled between the first contact pad and the second contact pad, and
   a second integrated passive device including a second capacitor structure, the second integrated passive device including a third contact pad coupled to the carrier amplifier output and a fourth contact pad coupled to the carrier output lead and wherein the second capacitor structure is coupled between the third contact pad and the fourth contact pad;
input circuitry configured to provide a carrier input signal to the carrier amplifier input and to provide a peaking input signal to the peaking amplifier input; and
a combining node configured to combine a carrier output signal from the carrier output lead with a peaking output signal from the peaking output lead, wherein the combining node is the carrier output lead of the package.

12. The amplifier of claim 11, wherein the first capacitor structure includes a plurality of capacitors formed in the first integrated passive device and each capacitor in the plurality of capacitors is a metal-insulator-metal capacitor.

13. The amplifier of claim 11, wherein the second integrated passive device includes a third capacitor structure and the third capacitor structure is coupled between a first node of the second capacitor structure and a first ground potential node.

14. The amplifier of claim 13, wherein the first integrated passive device includes a first inductor structure and the first inductor structure is coupled between a first node of the first capacitor structure and a second ground potential node.

15. The amplifier of claim 14, further comprising:
a first 2*f0 resonator coupled between the carrier output lead and a third ground potential node; and
a second 2*f0 resonator coupled between the peaking output lead and a fourth ground potential node.

16. An amplifier, comprising:
a substrate;
a package on the substrate, the package including:
   a carrier amplifier having a carrier amplifier input and a carrier amplifier output,
   a peaking amplifier having a peaking amplifier input and a peaking amplifier output,
   a carrier output lead,
   a peaking output lead,
   a first integrated passive device including a first capacitor structure, the first integrated passive device including a first contact pad coupled to the peaking amplifier output and a second contact pad coupled to the peaking output lead and wherein the first capacitor structure is coupled between the first contact pad and the second contact pad, and
   a second integrated passive device including a second capacitor structure, the second integrated passive device including a third contact pad coupled to the carrier amplifier output and a fourth contact pad coupled to the carrier output lead and wherein the second capacitor structure is coupled between the third contact pad and the fourth contact pad;
input circuitry configured to provide a carrier input signal to the carrier amplifier input and to provide a peaking input signal to the peaking amplifier input;
a combining node configured to combine a carrier output signal from the carrier output lead with a peaking output signal from the peaking output lead; and
a first bias circuit coupled to the peaking amplifier output, wherein the first bias circuit includes a first bias feed line and wherein the first integrated passive device includes a first fundamental frequency resonator coupled to the first bias feed line and the first fundamental frequency resonator includes a first capacitor and a first inductor connected in parallel.

17. The amplifier of claim 16, further comprising a second bias circuit coupled to the carrier amplifier output, wherein the second bias circuit includes a second bias feed line and wherein the second integrated passive device includes a second fundamental frequency resonator coupled to the second bias feed line and the second fundamental frequency resonator includes a second capacitor and a second inductor connected in parallel.

18. A packaged device, comprising:
a substrate;
a first input lead;
a second input lead;
a first output lead;
a second output lead;
a first amplifier having a first amplifier input and a first amplifier output, wherein the first amplifier input is coupled to the first input lead;
a second amplifier having a second amplifier input and a second amplifier output, wherein the second amplifier input is coupled to the second input lead;
a first integrated passive device including a first capacitor structure, the first integrated passive device including a first contact pad coupled to the first amplifier output and a second contact pad coupled to the first output lead and wherein the first capacitor structure is coupled between the first contact pad and the second contact pad; and
a second integrated passive device including a second capacitor structure, the second integrated passive device including a third contact pad coupled to the second amplifier output and a fourth contact pad coupled to the second output lead and wherein the second capacitor structure is coupled between the third contact pad and the fourth contact pad,
wherein the first integrated passive device includes a third capacitor structure and the third capacitor structure is coupled between a first node of the second capacitor structure and a first ground potential node and the second integrated passive device includes a first inductor structure and the first inductor structure is coupled between a first node of the first capacitor structure and a second ground potential node.

* * * * *